(12) United States Patent
Breinlinger et al.

(10) Patent No.: US 7,946,853 B2
(45) Date of Patent: May 24, 2011

(54) COMPLIANT ELECTRO-MECHANICAL DEVICE

(75) Inventors: Keith J. Breinlinger, San Ramon, CA (US); Arash Behziz, Thousand Oaks, CA (US)

(73) Assignee: Teradyne, Inc., North Reading, MA (US)

( * ) Notice: Subject to any disclaimer, the term of this patent is extended or adjusted under 35 U.S.C. 154(b) by 740 days.

(21) Appl. No.: 11/479,205

(22) Filed: Jun. 29, 2006

(65) Prior Publication Data

US 2007/0004238 A1 Jan. 4, 2007

Related U.S. Application Data

(60) Provisional application No. 60/697,078, filed on Jul. 2, 2005.

(51) Int. Cl.
*H01R 12/00* (2006.01)

(52) U.S. Cl. .......................................... 439/63; 439/581

(58) Field of Classification Search .................... 439/63, 439/578, 581, 700; 324/754, 761, 158.1
See application file for complete search history.

(56) References Cited

U.S. PATENT DOCUMENTS

| | | | |
|---|---|---|---|
| 2,757,351 A | | 7/1956 | Klostermann |
| 4,082,940 A | * | 4/1978 | Knowles et al. ............... 219/239 |
| 4,588,241 A | * | 5/1986 | Ardezzone ..................... 439/581 |
| 4,740,746 A | * | 4/1988 | Pollock et al. ................. 324/761 |
| 4,892,491 A | | 1/1990 | Budano |
| 4,895,521 A | * | 1/1990 | Grabbe .......................... 439/63 |
| 6,039,580 A | * | 3/2000 | Sciarretta et al. .............. 439/63 |
| 6,758,680 B2 | * | 7/2004 | Duquerroy et al. ............. 439/63 |
| 7,416,418 B2 | * | 8/2008 | Berthet et al. .................. 439/66 |

FOREIGN PATENT DOCUMENTS

| | | |
|---|---|---|
| WO | WO 92/20120 | 11/1992 |
| WO | WO 92/20120 A1 | 11/1992 |

OTHER PUBLICATIONS

Office Action mailed Apr. 6, 2010 in Japanese Application No. JP2008-519716.
Office Action issued Mar. 11, 2010 in Chinese Application No. 200680024202.3.
Mar. 24, 2010 letter from China Sinda Intellectual Property regarding Mar. 11, 2010 Office Action in Chinese Application No. 200680024202.3.
Response to Office Action of Mar. 11, 2010 in Chinese Application No. 200680024202.3.
Office Action issued Feb. 1, 2011 in Japanese Application No. 2008-591716.
Summary of Feb. 1, 2011 Decision of Rejection in Japanese Application No. 2008-591716.

* cited by examiner

*Primary Examiner* — Xuong M Chung Trans
(74) *Attorney, Agent, or Firm* — Wolf, Greenfield & Sacks, P.C.

(57) ABSTRACT

In one embodiment, a compliant contactor is provided which includes a center conductor and an outer conductor with a spacer therebetween. The outer conductor has a mating end adapted to be capable of flexibly contacting an outer conductor mating surface prior to the center conductor contacting a center conductor mating surface.

24 Claims, 6 Drawing Sheets

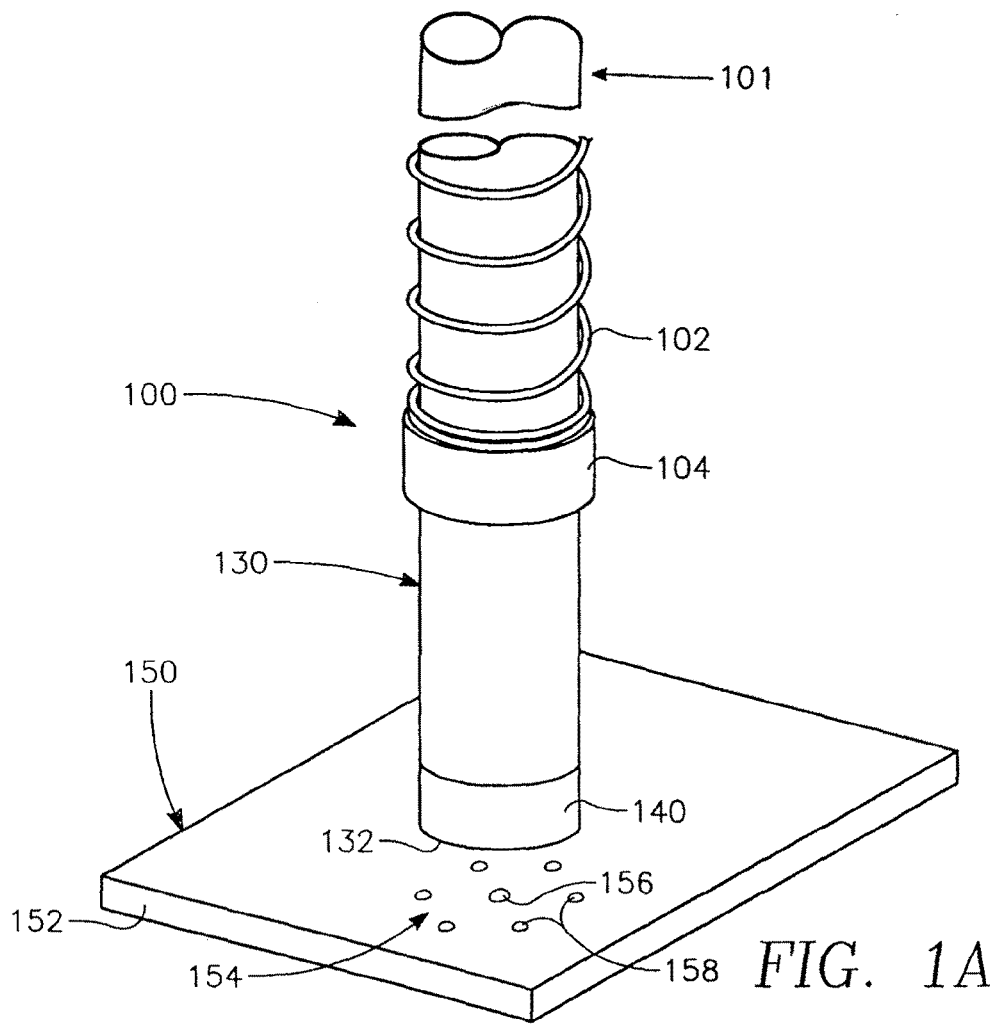
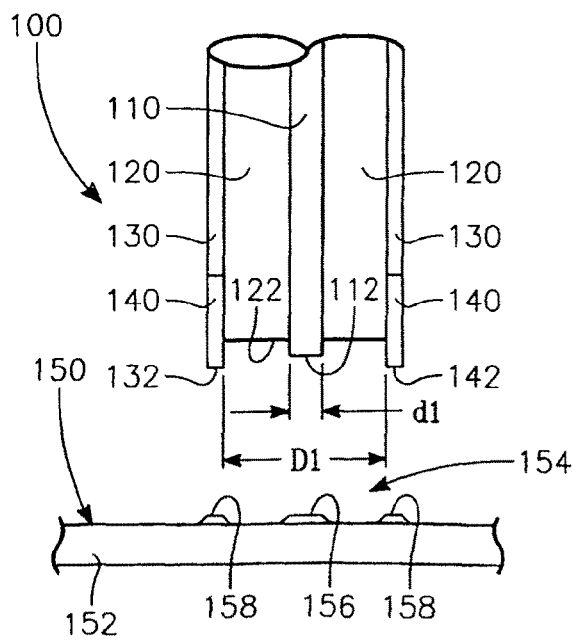 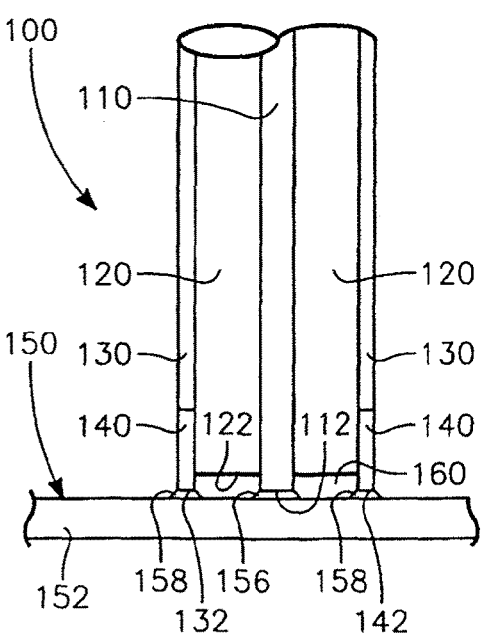
FIG. 1A
FIG. 1B
FIG. 1C

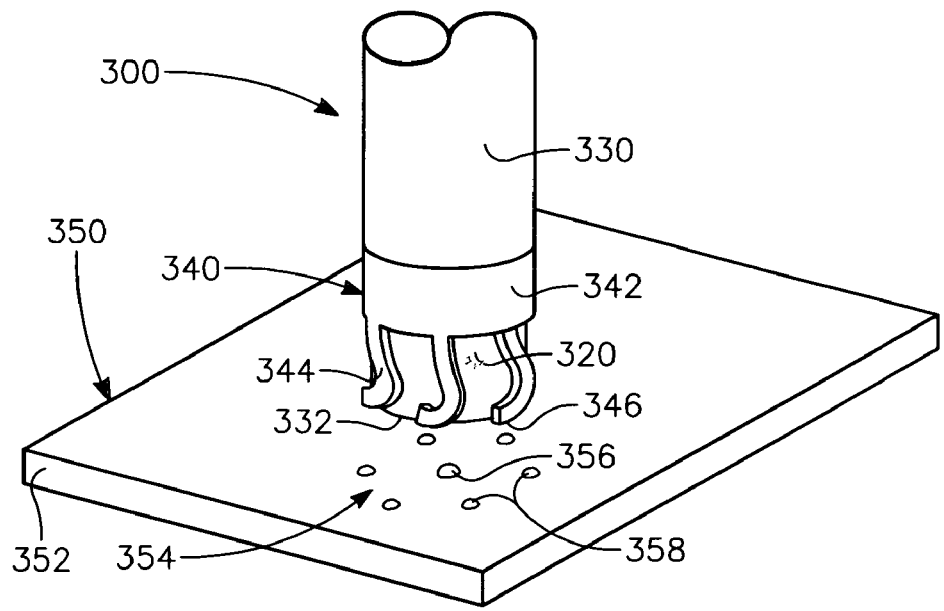
FIG. 3A
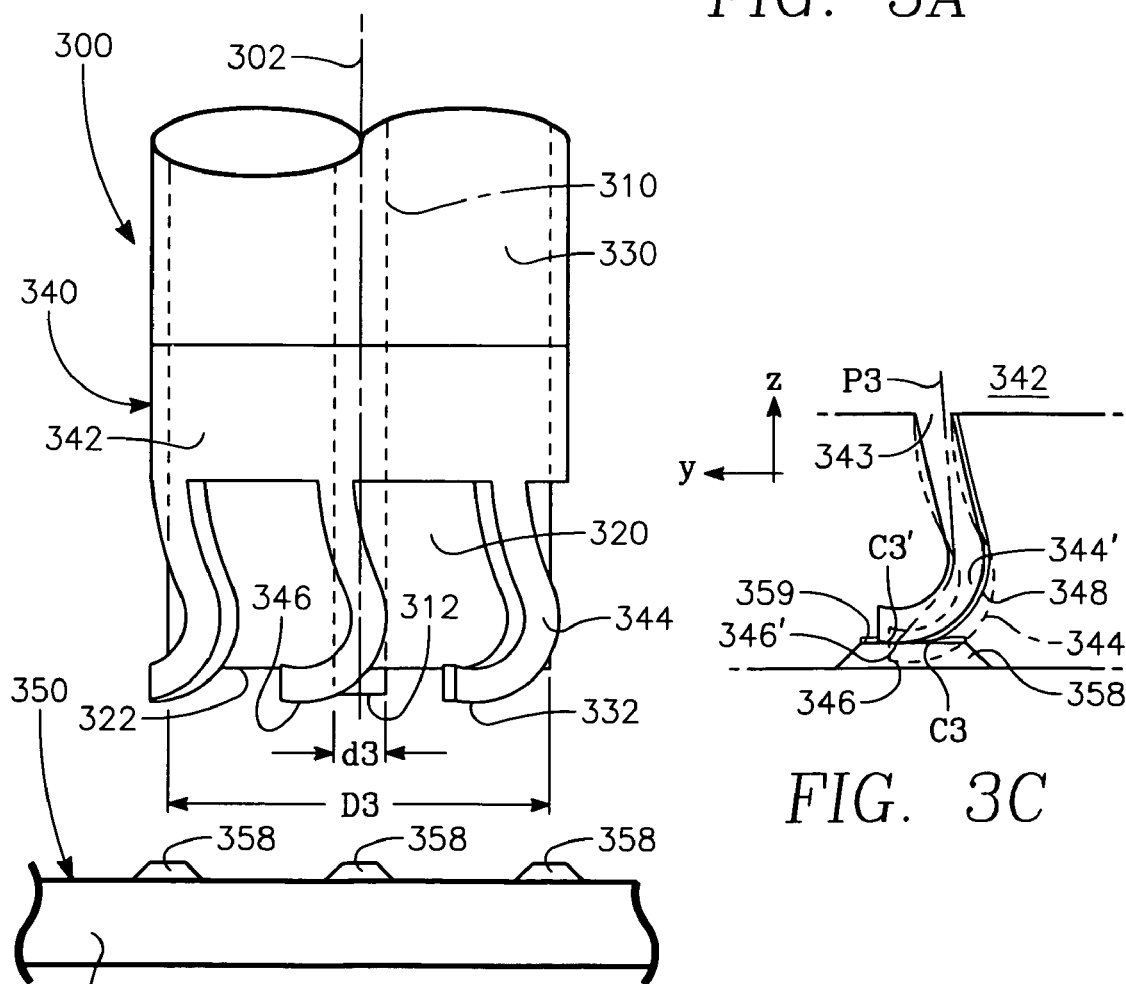
FIG. 3C
FIG. 3B

COMPLIANT ELECTRO-MECHANICAL DEVICE

CROSS REFERENCE TO RELATED APPLICATION

This application claims the benefit of U.S. Provisional Application No. 60/697,078, filed on Jul. 2, 2005, by Keith J. Breinlinger, et al., entitled, COMPLIANT ELECTRO-MECHANICAL DEVICE, herein incorporated by reference in its entirety.

BACKGROUND

In many applications, high performance electrical connections must be made between one device and another. Many factors can reduce performance by adversely effecting these connections. Such factors can include signal reflections caused by impedance discontinuities within and between the devices, degraded electrical connections from gaps and/or surface coatings between the devices, cross-talk due to signal transmission and reception between adjacent devices, discontinuities caused by differential electrical lengths or pathways, as well as the generation of electrical inductance within the devices. Reducing or eliminating the effect of these factors can provide increased system performance.

One example of an application where connections having high signal performance is strongly desired, is with test platforms or other automated test equipment (ATE). Such equipment provides semiconductor manufacturers the capability of individually testing each and every semiconductor device fabricated during production. The testing can be performed using contactors which make electrical connections between the tester and the device interface board, or DIB, which is in turn connected to the device under test, or DUT. The contactors can carry test signals which are used to verify the operation of the DUT and ensure that the devices work properly before they are shipped to customers.

Contactors and the DIB must be manufactured to close tolerances to achieve proper electrical connections therebetween. Further, to allow the use of higher test signal frequencies in ATEs, contactors increasingly need better high frequency performance. To obtain such close tolerances and increased performance adds significant cost and complexity to the ATE.

Therefore, a need exists for contactors which can achieve the desired electrical connection and high signal performance, while limiting or reducing costs and device complexity.

SUMMARY

In some embodiments, the present invention is a compliant electro-mechanical device having good impedance control along its entire length to minimize reflections and thereby increase performance. The device can be any of a variety of different apparatuses including a probe, a power probe, a connector, a contactor, an interconnect, an interposer, a loose connector. The device can be used in any of many different applications, for example with test platforms, ATEs, manual testing, high speed connections, supercomputers, and the like.

The device is compliant to provide electrical connections by compensating for misalignments, offsets or gaps between the device and the surface which it is received. The device also provides a constant, or at least substantially constant, impedance along its length for each deformation and/or deflection of the device. In addition, the device is compliant while having a defined and consistent electrical length for a given device and across a series of such devices. The device can be configured such that the compliance is provided without inductance due to the structural shapes, such as spirals or the like. Further, the device is capable of removing surface coatings at the points of contact for improved electrical connections. The device can have shielding to prevent or limit signal transmission, cross-talk, RF leakage, EMI, and/or electrical noise. Also, the device can minimize, or limit, any differences between the lengths of the electrical pathways of the center and outer conductors to reduce or eliminate any discontinuities.

In some embodiments, the device is a contactor which includes a center conductor, a compliant outer conductor, and a spacer position between the center conductor and the outer conductor. The spacer is positioned about the center conductor and the outer conductor is positioned about the spacer. The spacer can be a structural material, air or the like, depending on the embodiment. In some embodiments, the center conductor, the spacer and the outer conductor are positioned in a coaxial and/or concentric manner to one another. In other embodiments the center conductor, spacer and outer conductor are arranged in a non-concentric manner or otherwise offset to one another. The center conductor can be a center pin, a signal conductor, or a signal conduit and there can be more than one center conductor. The center conductor is conductive and is capable of carrying a signal within the contactor. The center conductor can be round having a center conductor outer diameter. The outer conductor can be a shield, a shield conductor, a ground or a return. The outer conductor is conductive and is capable of functioning as a ground, as a shield, a return and/or a signal return. As a shield, the outer conductor can prevent, or limit, the amount of signal transmission from the contactor, cross-talk between the contactor and other adjacent devices, RF leakage, EMI, and/or electrical noise. The outer conductor is cylindrically shaped, having an outer conductor and an inner diameter. The spacer is an insulator which can be a non-conductor, a semi-conductor or an ESD material. The spacer can prevent, or limit, electrical shorts, or shorting, between the center conductor and the outer conductor. The spacer can also function to control the impedance of the signal. The spacer can be any of a variety of materials, including a dielectric such as a TEFLON or a foamed TEFLON, and/or LCP, air or a vacuum.

In some embodiments, the outer conductor is deformable or otherwise compliant, being capable of deflecting and/or deforming to compensate for any misalignment, offset or gaps between the conductor and the surface which it is received upon. This compliance reduces the need for precision manufacturing at close tolerances and/or precise alignment to obtain acceptable electrical connections between the contactor and the receiving surface. The outer conductor can also be biased to urge the compliant section on to the receiving surface to facilitate electrical connections.

In some embodiments, the outer conductor maintains impedance continuity along the length of the contactor by having its deformable section maintain a constant inner diameter. In other embodiments variations to the inner diameter of the outer conductor are compensated for with corresponding changes to either the outer diameter of the center conductor and/or to the dielectric constant of the spacer.

In some embodiments, the compliant section of the outer conductor includes deformable members which provide improved electrical connections by scrubbing and/or scrapping off any coatings, oxides and/or organic films on the contact surfaces of the contactor and the surface receiving the contactor. In some embodiments, the deformable members are shaped to minimizes, or limit, any differences between the lengths of the electrical pathways of the center and outer conductors to reduce any discontinuities created by such a difference.

BRIEF DESCRIPTION OF THE DRAWINGS

The features and advantages of the present invention will be better understood with regard to the following description, appended claims, and accompanying drawings where:

FIG. 1A shows a perspective view of a device in accordance with at least one embodiment of the present invention. FIG. 1A is herein also referred to as FIG. 1A.

FIGS. 1B and 1C show side cross-section views of a device in accordance with at least one embodiment of the present invention. FIGS. 1B and 1C are herein also referred to as FIGS. 1B and 1C, respectfully.

FIG. 2A is herein also referred to as FIG. 2A.

FIGS. 2B and 2C are herein also referred to as FIGS. 2B and 2C, respectfully.

FIG. 3A shows a perspective view of a device in accordance with at least one embodiment of the present invention. FIG. 3A is herein also referred to as FIG. 3A.

FIGS. 3B and 3C show side views of a device in accordance with at least one embodiment of the present invention. FIGS. 3B and 3C are herein also referred to as FIGS. 3B and 3C, respectfully.

FIG. 4 is herein also referred to as FIG. 4.

FIG. 5 is herein also referred to as FIG. 5.

FIG. 6 is herein also referred to as FIG. 6.

FIG. 7 is herein also referred to as FIG. 7.

FIG. 8 is herein also referred to as FIG. 8.

DESCRIPTION

Figure 2A:
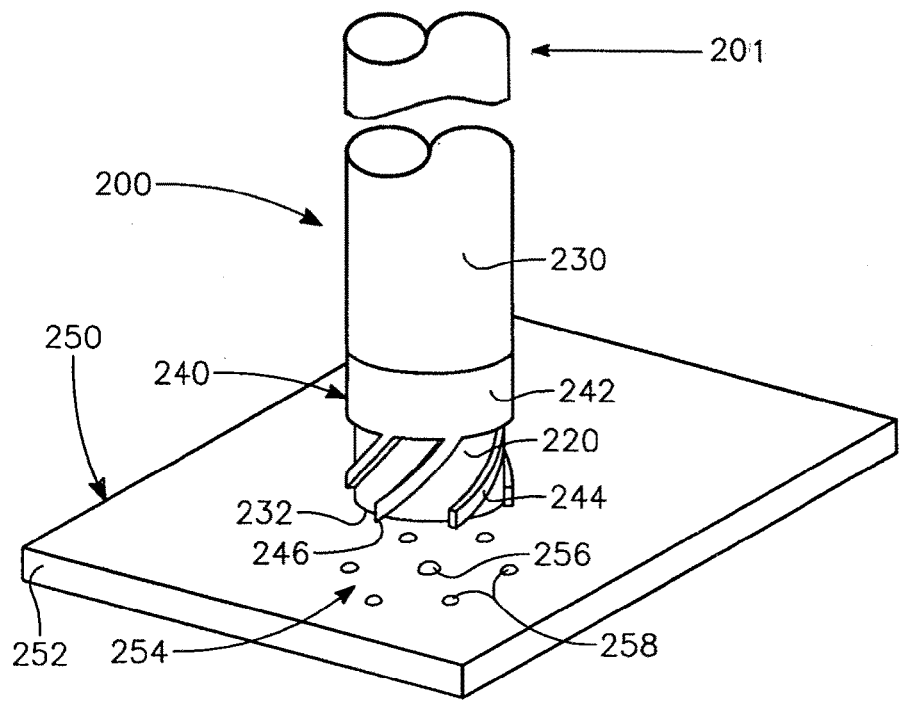
FIG. 2A shows a perspective view of a device in accordance with at least one embodiment of the present invention.

In some embodiments, the present invention is a compliant electro-mechanical device having good impedance control along its entire length to minimize reflections and thereby increase performance. The device can be any of a variety of different apparatuses including a contactor, a probe, a power probe, a connector, a contactor, an interconnect, an interposer, a loose connector. The device can be used in any of many different applications, for example with test platforms, ATEs, manual testing, high speed connections, supercomputers, and the like.

The device is compliant to provide electrical connections by compensating for misalignments, offsets or gaps between the device and the surface which it is received. The device also provides a constant, or at least substantially constant, impedance along its length for each deformation and/or deflection of the device. In addition, the device is compliant while having a defined and consistent electrical length for a given device and across a series of such devices. The device can be configured such that the compliance is provided with minimum inductance due to the structural shapes, such as spirals or the like. Further, the device is capable of removing surface coatings at the points of contact for improved electrical connections. The device can have shielding to prevent or limit signal to signal transmission, cross-talk, RF leakage, EMI, and/or electrical noise.

In some embodiments, the device can reduce or minimize impedance discontinuities that are due to differences in lengths electrical pathways of the inner and outer conductors. Of course, many factors can affect the impedance, such as windings, conductor thickness, separation, dielectrics, and the like.

In some embodiments of the present invention, the compliance of the device can include any of deformation, deflection, travel, compressibility, mechanical stroke, flexibility, and the like.

In some embodiments the compliant section of the device is attached or integral to the contactor such that a minimum of contact points exist along the path of a signal traveling through the device and any cables or structures attached thereto. This minimization of the number of contact points can result in a reduction of impedance discontinuities.

Compliant Conductor:

In various embodiments the device is a contactor which includes a deformable compliant conductor having one or more deformable and/or deflectable members. These members extend from a conductor of the contactor, such that they are capable of touching electrical contacts of a structure which receives the contactor. By deforming and/or deflecting upon contact with the receiving structure, the members provide the conductor with a compliance capability. With these members being electrically conductive, the conductor can be in electrical communication with the receiving structure upon contact. The particular arrangement or configuration of the deformable member, or members, can vary depending on the embodiment of the invention.

At least one embodiment is set forth in FIGS. 1A-C. As shown, a contactor 100 includes a center or inner or first conductor 110, a spacer 120, and an outer or second conductor 130. The center conductor 110, the spacer 120 and the outer conductor 130 are positioned in a coaxial and/or concentric manner. As shown, the contactor 100 is positioned above a receiving structure 150, which includes a base or substrate 152 and contacts or pads 154 positioned thereon. The pads 154 are arranged to be capable of receiving the contactor 100. The contacts 154 include a center or signal pad 156 for receiving the center conductor 110, and outer or ground pads 158 for receiving the outer conductor 130, as the contactor 100 contacts the structure 150.

The contactor 100 can be attached to a cable 101 on an end (not shown) opposite of the receiving structure 150. The attached cable can be a coaxial cable and can be floating, such that the cable moves with the displacement of the contactor 100.

Depending on the embodiment, the center conductor 110 can in some embodiments be a center pin, a signal conductor, or a signal conduit, or the like. The center conductor 110 can function to carry the signal within the contactor 100. The center conductor 110 includes an end 112, and as shown in FIG. 1B, the center conductor 110 has an outer diameter d1. The center conductor 110 can be solid (as shown), hollow, of a stranded wire, or may have other configurations. Also, the center conductor 110 can be fixed, undeformable, or at least substantially undeformable. By being undeformable, or at least substantially undeformable, the center conductor 110 provides a specific defined electrical length of the contactor 100. This defined length of the contactor 100, is independent of any compliance, deformation and/or deflection of the outer conductor 130, as further described herein. As such, changes in the compliance of the outer conductor 130 do not affect the electrical length of the contactor 100.

The center conductor 110 can be any of a variety of materials, including conductive materials such as copper, gold, stainless steel, beryllium copper, a gold plated material such as stainless steel plated in gold or beryllium copper plated in gold, and the like.

In some embodiments the center conductor 112 can be formed to facilitate electrical contacts by having a shaped tip at the end 112. Such shaped tips can include crown tips, pointed tips, rough surfaces, or the like.

In contrast to the center conductor 110, the spacer 120, can in some embodiments, be an insulator which can be a non-conductor, a semi-conductor or an ESD material. This allows the spacer 120 to prevent electrical shorts, or shorting, between the center conductor 110 and the outer conductor 130. The spacer 120 can function as the dielectric medium. The spacer 120 can also function to physically position the center conductor 110 and the outer conductor 130 and maintain their respective positions. The spacer 120 can include an end 122, which can be located at any of a variety of positions along the length of the contactor 100. In the embodiment shown, the end 122 is positioned such that both the center conductor end 112 and an end 132 of the outer conductor 130, extend out past the end 122.

The spacer 120 can also function to control the impedance of the signal. That is, changing the size and/or material of the space 120 can affect the impedance along the length of the contactor 100, as further set forth herein.

The spacer 120 can be any of a variety of materials, including ceramics, plastics, rubber, or other dielectrics and the like. In some embodiments the spacer 120 is air, a gas or even a vacuum. Some typical dielectrics include TEFLON, which is available from DuPont of Wilmington, Del., a foamed or aerated TEFLON, which is available from W. L. Gore of Elkton Md., ULTEM from GE Plastics of Detroit, Mich., and/or the like. The spacer 120 can have a dielectric constant, $\in_r$, which can vary depending on the material used and the embodiment of the present invention.

The outer conductor 130 can be a shield, a shield conductor, a ground, a return or the like. That is, depending on the embodiment, the outer conductor 130 can be conductive and function as a ground, a shield, a return, and/or a signal return. The outer conductor 130 can function to prevent, or limit, the amount of signal transmission or leakage from the contactor 100, the amount of cross-talk between the contactor 100 and other adjacent devices, RF leakage, EMI, and/or electrical noise. The outer conductor 130 can also function as a reference or as a current return path. As shown in FIG. 1B, the outer conductor 130 has an inner diameter D1.

The outer conductor 130 can be any of a variety of materials, including conductive materials such as copper, gold, stainless steel, beryllium copper, a gold plated material such as stainless steel plated in gold or beryllium copper plated in gold, and the like.

As noted herein, in some embodiments, impedance along the contactor 100 is controlled and kept relatively constant to avoid impedance discontinuities. Minimizing or eliminating impedance discontinuities provides improved performance by reducing or eliminating reflections in the contactor. Generally, the impedance can be determined by the equation E1:

$$Z_0 = \sqrt{L/C} \tag{E1}$$

Where L is the inductance and C is the capacitance. As such, the impedance is generally inversely proportional to the capacitance. With a coaxial arrangement of the contactor, the capacitance is related, among other factors, to the outer diameter of the center conductor, the inner diameter of the outer conductor and the dielectric constant of the spacer positioned between the inner and outer conductors.

In certain specific cases, a equation E2 can be used for determining the impedance. These cases are limited to situations which include a concentric coaxial contactor with a homogeneous dielectric at high frequencies:

$$Z = 60/\sqrt{\in_r} \ln(D/d) \tag{E2}$$

Where the Z is the impedance, $\in_r$ is the dielectric constant of the spacer or insulator, d is the outer diameter of the center conductor, and D is the inner diameter of the outer conductor.

More generally, the impedance can be determined by the equation E3 for all frequencies, which is:

$$Z_0 = \sqrt{\frac{R' + j2\pi f L'}{G' + j2\pi f C'}} \tag{E3}$$

As can be seen by these equations, the impedance can be dependent on the diameter d1 of the center conductor 110, the diameter D1 of the outer conductor 130, and the dielectric constant $\in 1$ of the spacer 120. In general, as the spacing between D and d increases, the capacitance decreases and the inductance increases. As a result, the impedance can decrease as the distance between the center pin and the ground decreases and the impedance can increase when this distance increases. Of course, the effect on the impedance is also dependant on many other factors not specifically set forth here.

Some changes to the center conductor 110 and to the outer conductor 130 may not significantly affect the impedance of the contactor 100. For example, generally, if the outer diameter of the outer conductor 130 is enlarged at some point along the contactor 100, while the inner diameter, D1, remains the same, then the impedance Z may be kept at the same value, depending of course on a variety of other factors which affect impedance. It should be noted that the impedance can be more sensitive to finite changes to the center conductor then changes to the outer conductor, because the ratio of the outer diameter of the inner conductor to the inner diameter of the outer conductor is impacted more as the outer diameter of the center conductor is always smaller than the inner diameter of the outer conductor.

Unlike other devices, some embodiments of the present invention maintain a more constant impedance by keeping the diameters d and D and the relative dielectric constant $\in_r$, constant along the length of the contactor. In addition, in some embodiments, impedance is controlled by limiting the rotation of the compliant section about the contactor and so that one or both of the diameters d1 and D1 are sized with respect to the arrangement of the deformable members (number, size, etc.).

Some embodiments of the present invention also seek to maintain an unvarying dielectric constant along the length of the contactor to prevent impedance discontinuities. The relative dielectric constant is a measure of the electric permittivity of the material relative to a perfect vacuum. A vacuum has a relative dielectric constant of 1.00000. The dielectric constant varies depending on the material used in the given embodiment. For example, generally air has a dielectric constant of about 1.00059, TEFLON (PTFE) has a dielectric constant of about 2.05, and ULTEM has a dielectric constant of about 3.1.

As noted herein in some embodiments, a change in the dielectric constant of the material between the conductors can occur along the length of the contactor 100. For example, as shown in FIG. 1C, at the point of contact between the contactor 100 and the receiving structure 150, a gap 160 can exist which causes a change in the dielectric constant from that of the spacer 120. The gap 160 can be of the surrounding gas, for instance air. To reduce the effect of the gap 160 on the contactor's performance, the outer conductor 130 by being compliant, can minimize the length or height of the gap 160.

In some embodiments, the effect of the change in the dielectric constant at the gap 160 is compensated for by changing the diameters d1 and/or D1, such that a constant value of the impedance Z is maintained. Additionally, the surface area of either can be varied to compensate for the change in dielectric constant.

To control the impedance of the contactor 100 along its length, some embodiments of the present invention configure the outer conductor 130 to be compliant, without change to the inner diameter D. That is, some embodiments allow a deformation or deflection of the outer conductor 130, while maintaining electrical conductivity, without imparting more than a minimal or insufficient impedance discontinuity to the contactor 100.

Further, in various embodiments, the outer conductor 130 can be compliant, such that it will compensate for any misalignment, offset or gaps between the contactor's conductors 110 and 130 and the pads 154 of the receiving structure 150, as the contactor 100 and the structure 150 come into contact. That is, by being compliant, the outer conductor 130 is capable of providing contact with the outer pads 158, while the center conductor 110 is in contact with the center pad 156, as shown in FIG. 1C. The compliant aspect of the conductor 130 allows contact to be achieved both at the center conductor 110 and about the outer conductor 130, without the need for a perfect or highly precise alignment between the center contactor end 112 and the outer conductor end 132. That is, the complaint outer conductor 130 compensates for misalignments which typically exist between such structures, which can be due to manufacturing tolerances, deformations in the surface of the receiving structure 150 and/or the pads 154, differential thermal expansion of materials, deformation due to wear, and the like.

Depending on the embodiment, the entire outer conductor 130 or just a portion of it can be deformable or otherwise compliant. For instance, in the embodiments shown in FIGS. 1A-C, the outer conductor 130 is deformable at a compliant section or portion or member 140, which is positioned adjacent the end 132. In other embodiments, the deformable or complaint section of the outer conductor 130 could be at a different position, or positions, along the outer conductor 130, with one or more rigid, or semi-rigid portions set at or adjacent to the end 132.

In some embodiments the center conductor 110 is also compliant, deformable and/or deflectable. For example, a pogo pin or spring pin can be used for the center conductor 110.

The compliant section 140 of the device is attached or integral to the outer conductor 130. The compliant section 140 and the outer conductor 130 can be a single element or at least effectively a single element. This allows for a reduction in the number of transitions or contact points between structures along the path of a signal traveling through the contactor 100 and any cables or structures attached thereto. This reduction of transitions or contact points can result in a reduction of impedance discontinuities that could otherwise occur at such locations.

In various embodiments, the compliant section 140 is removable, to allow replacement. As shown in FIG. 1C, as the contactor 100 contacts the structure 150, the compliant section 140 deforms or deflects to establish contacts both between the outer conductor 130 and the outer pads 158, and then between the center conductor 110 and the center pad 156.

In at least one embodiment, as shown in FIG. 1B, in its initial undeflected state the compliant section 140 extends beyond, or below, the end 112 of the center conductor 110. This differential positioning of the ends 112 and 132, allows the compliant section 140 to make contact with the outer pads 158 prior to the center conductor 110 contacting the center pad 156. This assures that contact is made and maintained at all the points between the contactor 100 and the structure 150.

With the center conductor 110 being non-compliant, undeformable, or substantially undeformable, the electrical length of the contactor 100 is fixed and separate from the amount of compliance, deformation, or deflection of the compliant section 140.

In some embodiments, the end 112 and end 132 can be positioned at different positions relative to one another than that shown in the FIGS. 1B and C. Various positioning of the ends of the conductors can be employed while maintaining differential positioning, such that the compliant section 140 contacts the outer pads 158, and is capable of being deflected, prior to the contact of the center conductor 110 with the center pad 156. Such other positioning of the ends includes where the end 132 extends much further outward than the end 112, to allow for greater compliance of the outer conductor 130, or to accommodate pads which are positioned out of plane or otherwise unevenly with one another. Likewise, in other embodiments, the end 112 can extend outward from the contactor 100 further than the end 132, also for use with unevenly aligned pads. Unevenly aligned pads could include a stepped arrangement, where either pads 156 or 158 extend out from the structure 140 further than the other pad or pads.

Depending on the embodiment, the compliant section 140 can be deformable over a range to account for misalignments between the contactor 100 and the receiving structure 150. This allows a given contactor 100 to be capable of being employed with a variety of different receiving structures.

In various embodiments, the specific aspects of each component of the contactor 100 and the receiving structure 150 can vary. For instance, some embodiments of the compliant section 140 are set forth in detail herein. Of course, it will be apparent to one skilled in the art that many other embodiments than those specifically shown are possible and within the scope of the present invention. For example, in other embodiments the center conductor 110, spacer 120 and outer conductor 130 can be arranged in a substantially or generally concentric or coaxial manner, or in other embodiments arranged in a non-concentric manner or otherwise offset to one another. Likewise, in some embodiments more than one center conductor 110, spacer 120 and/or outer conductor 130 can be used. Further, the shapes of each of the center conductor 110, spacer 120 and/or outer conductor 130 can vary.

Additional embodiments of the present invention include the outer conductor 130 and the spacer 120 generally oval in shape, with the space positioned within the outer conductor 130. In these embodiments the there are at least two inner conductors 110 spaced along the length of the oval shape of the spacer. In some embodiments the arrangement of the inner conductors 110 are in differential pairs and/or twinax arrangements.

In one or more embodiments at least one center conductor 110 can be compliant or otherwise deformable or deflectable including a spring pin or the like. These embodiments allow one center conductor to be fixed in length to define the electrical length of the contactor 100 and the other center conductor(s) to be compliant to establish electrical contacts with the receiving structure.

As shown in FIG. 1A, the contactor 100 can also include a biasing member 102 and a stop or limiter 104 about the outer conductor 130. The biasing member 102 can be a spring or other deformable structure which through the stop 104 is capable of exerting a biasing force onto the remaining portion of the contactor 100. In so doing, the biasing member 102 can bias the contactor 100 such that it will be urged towards its undeflected position, such as shown in FIGS. 1A and B as the contactor is deflected, such as shown in FIG. 1C.

In some embodiments, a floating or movable cable (not shown) is attached to the contactor 100 at an end (not shown) opposite of the end 132. As such the attached cable can move with the displacement of the biasing member 102.

The biasing member 102 allows the contactor 100 to be able to maintain contact with the receiving structure to facilitate electrical connections therewith. Also, with the biasing member 102 the contactor 100 can adjust to accommodate various positions of surfaces of a given receiving structure or for a number of different receiving structures. With a series of contactors, such as in an array, the biasing member 102 allows each contactor 100 to be deflected to account for changes across the surface of the receiving structure 150. Such surface changes in the receiving structure could include a warped, deflected or bent surface or be the result of manufacturing tolerances.

In various embodiments a spring constant, $k_s$, of the spring 102 is greater than a spring constant, $k_c$, of the compliant section 140. This aids in allowing the compliant section 140 to obtain good electrical connections between the contactor 100 and the receiving structure 150. Also, with a higher spring constant for the spring 102, more displacement will occur with the compliant section 140 than with the spring 102, as the contactor 100 contacts the receiving structure 150. When the fixed center conductor 110 reaches the center pad 156 then the compliant section will stop being deformed or deflected, setting the contactor 100 a specific length. After the center conductor 110 makes contact then the entire contactor 100 will move by deflecting the spring 102.

The spring 102 can be pre-loaded to require that a predefine load is applied prior to deflection of the spring 102. In such embodiments the spring constant, $k_s$, can be less than the spring constant, $k_c$, as the pre-load will still require that the compliant section 140 is deflected prior to any deflection of the spring 102. This assures that the center conductor make contact with the center pad 156 prior to displacement of the contactor 100.

In some embodiments, the contactor 100 can have a biasing force exerted upon it by a structure other than a spring, such as a flexure or other deformable structure, a weight, air pressure, or other biasing structure. Also, some embodiments can include more than a single spring and/or spring with varying spring constants.

Figure 2B:
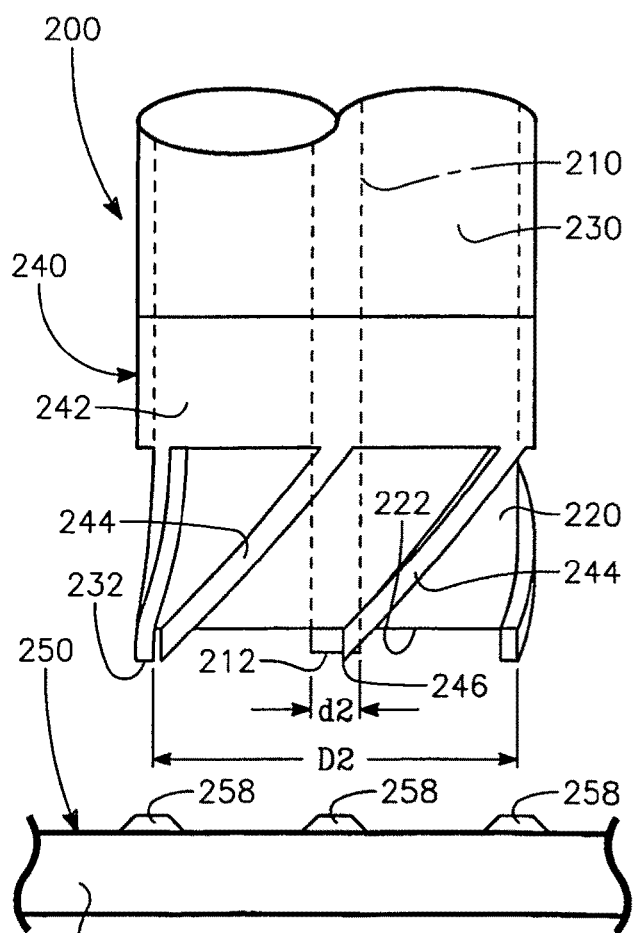
FIGS. 2B and 2C show side views of a device in accordance with at least one embodiment of the present invention.
Figure 2C:
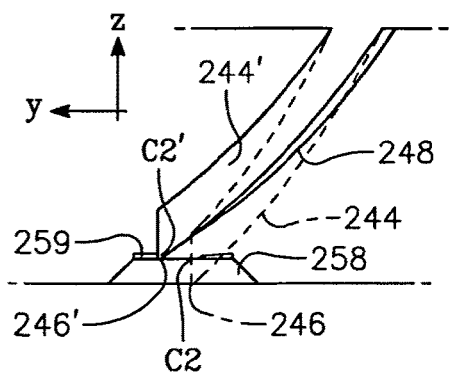

Compliant Sections with Helix Shaped Members:

Some embodiments of the present invention include a contactor that has a compliant section with one or more deformable members extending therefrom. As shown in FIGS. 2A-C, a contactor 200 includes a center or inner or first conductor or conduit or signal conductor 210, a spacer or insulator 220, and an outer or second conductor or ground or shield or return 230. The outer conductor 230 is compliant by being deformable and includes a compliant section or portion or member 240 positioned at least adjacent to an end 232. In FIG. 2A the contactor is positioned above a receiving structure or device interface board or DIB 250 which includes contact pads 254 on a base or substrate 252. The contact pads 254 include a center or inner or signal pad 256 and outer or ground pads 258.

The contactor 200 can be attached to a cable 201 on an end (not shown) opposite of the receiving structure 250. The attached cable can be a coaxial cable and can be floating, such that the cable moves with the displacement of the contactor 200.

In some embodiments, the center conductor 210 is undeformable, or at least substantially undeformable, so that it provides a specific defined electrical length of the contactor 200. The defined length of the contactor 200 is independent of any compliance, deformation and/or deflection of the compliant section 240 of the outer conductor 230, as further described herein. As such, changes in the compliance of the compliant section 240 do not affect the electrical length of the contactor 200.

The compliant section 240 includes deformable members or beams or fingers 244 extending out (downward as shown) from a base 242. Depending on the embodiment, the deformable members 244 can be shaped in a helix, coil, twist, spiral, a vertical crown or similar configuration as the deformable members 244 extend from the base 242. Further, the deformable members 244 can be straight, substantially straight, curved or bent in one or more directions, or any combination thereof.

In the embodiment shown, the deformable members 244 are generally straight curving around the spacer 220, and extending at a constant, or at least generally constant, angle relative to the base 242 along the length of each member 244. The angle of each member can vary in different embodiments depending on a variety of factors including the desired amount of deflection required by the compliant section 240, the desired spring constant of the complaint section 240, the structure, i.e. thickness, shape, etc., of the deformable members 244, the materials used in the compliant section 240, the desired amount of yielding, if any, for the structure, and other like factors. The angle of the members 244 can vary for each member 244, and in some embodiments, varies along the length of each member. The deformable members 244 each include an end 246.

As shown in FIG. 2B, in various embodiments the deformable members 244 are positioned in alignment with the rest of the outer conductor 230, such that the members 244 lie within a cylinder defined by the outer conductor 230. That is, the members 244 curve about the center of the contactor 200 along the length of the members 244, such that the members 244 retain the same inner diameter, and/or radius to the contactor's center, as the remaining portion of the outer conductor 230.

By keeping the members 244 in-cylinder with the outer conductor 230, and maintaining the diameters d2 and D2 the same, the complaint section 240 maintains a constant impedance. Eliminating or reducing impedance discontinuities positively affects the performance of the contactor 200. However, in some embodiments the members 244 may be shaped to either extend inward toward and/or outward from the center of the contactor 200 along their lengths.

As described herein with the contactor 100, for the contactor 200 the outer conductor 230 and its compliant section 240 can also be of any of a variety of the same or similar suitable materials as described. In various embodiments, the conductor 230 and compliant section 240 can be of conductive materials to allow the passage of electrical signals.

In some embodiments, the materials are deformable and/or flexible to allow the structure to return to, or in some cases at least towards, an undeflected and/or initial position. In some embodiments, the compliant section 240 will return completely, or at least substantially, to its undeflected position after deformation. In other embodiments, the material of the compliant section 240 will upon deflection, yield to some extent, such that any return will be less than to the original undeflected position. In some embodiments the compliant portion 234 is configured to yield during the initial deflection of the compliant section 240 to set or establish an undeflected position of the compliant section 240 for all further deformation of the compliant section 240.

As described herein with the outer conductor 230, the compliant section 240 can also be detachable from the remaining portion of the outer conductor 230. This allows for easier and faster replacement of the compliant section 240, in the event of breakage or wearing out.

FIG. 2C shows the contactor 200 in contact with the receiving structure 250. As can be seen the compliant section 240 has been deflected as it has come into contact with the pads 254. More specifically, the undeflected deformable members 244 (shown by the dashed lines) had contacted the pads 254 and then deflected as a deflected deformable member 244'. The deflected member 244' having a deflected end 246' positioned on the surface of the pad 258. The deflection of the deformable member 244 has moved the member 244 from its undeflected position, in a direction Z, towards the base 242, and in a direction Y, which is generally lateral to both the base 242 and the surface of the pads 254.

The Y direction, or lateral, movement of the deformable members 244 along the pads 258 is capable of providing an improved electrical contact between the pads 258 and the deformable members 244. Note that the movement is not necessarily lateral, or in the Y direction, but may be in a curved path or substantially in-cylinder. In many situations electrically conductive surfaces, such as the pads 254 and the ends 246, when exposed to an environment such as air can obtain a covering or coating of an oxide or other material, such as dirt and debris. Such coverings can reduce the electrical conductivity of the surface and thus reduce the performance of the device or devices involved. In some cases the build-up of oxides can be so extensive as to prevent electrical connections from being made. While the coatings can be removed from the affected surface by methods such as scraping or applying a solvent or cleaner, typically such operations are time intensive, cost prohibitive, impractical or effectively impossible.

However, embodiments of the present invention are capable of removing a coating 259 positioned over the pads 258 and coatings 248 over the deformable members 244, as shown in FIG. 2C. The deformable member 244 contacts its respective outer pad 258 at an initial location or contact point C2. Then as the compliant portion 244 is compressed and deflected, the deformable member 244 is moved both back towards the base 242 and across the surface of the outer pad 258. This movement of the deformable member 244 across the surface of the outer pad 258 causes a scrubbing and/or scraping action that clears the contacting surfaces of coatings or other build-up such as oxides and organic films. This allows the deflected deformable portion 244' at its deflected end 246' positioned at a point C2', to be cleared of its coating 248 and to have direct contact with the surface of the outer pad 258, which has also been cleared of its coating 259. This provides a better or improved electrical connection between the outer conductor 230 and the outer pads 258, increasing the overall performance of the contactor 200.

Depending on the embodiment, the amount of the scrubbing and/or scraping action can vary. By increasing the roughness of either the surface of the deformable member 244, the outer pad 258, and/or both, at the areas of contact therebetween, the amount of scrubbing and/or scraping action can be increased. Likewise, decreasing the surface roughness will decrease this action. In some embodiments, such contactors for use in highly oxidizing environments, long periods between uses, and/or lower frequency of contacts between contactor and receiving structure, thicker coating layers may exist which will require greater scrubbing or scraping to clear them. In other embodiments, such as contactors for use in less oxidizing environments and/or higher frequency of operation, decreased scrubbing and/or scraping action can be employed. In turn, less scrubbing will prolong the life of the compliant section and its respective pads. The geometry of the deformable member 244 can also determine the scrub length and therefore increase or decrease the amount of scrubbing. The amount of scrubbing and/or scraping action is also dependent on the force applied by the contactor 200 onto the receiving structure 250.

As shown, the distance of the scrubbing is between the points C2 and C2'.

In some embodiments, the use of gold for the deformable members 244 and/or on the pads 258, greatly reduces the amount of wear, extending the life of the contactor 200.

In some embodiments, the helix shape of the deformable members 244 can provide higher inductance due to the length of the path that the electrical current travel. As such, the helix shaped deformable members 244 can act as a spiral inductor. However, by limiting the length of the deformable members 244 to less than a rotation about the cylinder of the outer conductor 230, the amount of inductance will be sufficiently small that the outer conductor will effectively look, or function, as if the deformable members 244 were a substantially straight (along the z-axis) connection between the outer conductor 230 and the receiving structure 250. This is shown with the equation E4 for inductance:

$$L = \frac{\mu_0 N^2 \pi a^2}{b} * K_N \tag{E4}$$

This equation is as set forth in Transmission Line Handbook, by Brian C. Wandell, page 388, equation [6.3.1.1], which is hereby incorporated by reference in its entirety. Where N is the number of windings about the device. As can be seen, as N is less than one winding, the inductance is similar to a straight connection.

Of course, it will be apparent to one skilled in the art that many other embodiments than those specifically shown are possible and within the scope of the present invention. For example, in other embodiments the center conductor 210, spacer 220 and outer conductor 230 can be arranged in a substantially or generally concentric or coaxial manner, or in other embodiments arranged in a non-concentric manner or otherwise offset to one another. Likewise, in some embodiments more than one center conductor 210, spacer 220 and/or outer conductor 230 can be used. Further, the shapes of each of the center conductor 210, spacer 220 and/or outer conductor 230 can vary.

Compliant Sections with Shortened Electrical Paths:

In some embodiments of the present invention the contactor has a compliant section with one or more deformable members, which are shaped to reduce or minimize the both the inductance and length of the electrical current path. The minimization of the inductance is achieved by reducing or eliminating the amount of rotation of the path of the electrical current. Also, minimizing the electrical path in the deformable members also minimizes or eliminates any discontinuity due to differences in lengths of the paths traveled by the electrical current in the outer conductor and the center conductor.

As shown in FIGS. 3A-C, a contactor 300 includes a longitudinal axis 302, a center or inner or first conductor or center pin or signal conduit 310, a spacer or insulator 320, and an outer or second conductor or ground or shield or return 330. The outer conductor 330 is compliant by being deformable and includes a compliant section or portion or member 340 positioned at least adjacent to an end 332. In FIG. 3A the contactor 300 is positioned above a receiving structure or device interface board or DIB 350 which includes contact pads 354 on a base or substrate 352. The contact pads 354 include a center or inner or signal pad 356 and outer or ground pads 358. The contactor 300 is capable of moving in a direction along the direction of its longitudinal axis 302 (vertically as shown), to contact the receiving structure 350.

The contactor 300 can be attached to a cable (not shown) on an end (not shown) opposite of the receiving structure 350. The attached cable can be a coaxial cable and can be floating, such that the cable moves with the displacement of the contactor 300.

In some embodiments, the center conductor 310 is undeformable, or at least substantially undeformable, so that it provides a specific defined electrical length of the contactor 300. The defined length of the contactor 300 is independent of any compliance, deformation and/or deflection of the compliant section 340 of the outer conductor 330, as further described herein. As such, changes in the compliance of the compliant section 340 do not affect the electrical length of the contactor 300.

The compliant section 340 includes deformable members or beams or fingers 344 extending out (as shown downward) from a base 342. The deformable members 344 meet the base at a deformable member connection 343. The deformable members 344 of this embodiment are shaped to allow for deformation by bending while reducing or minimizing the length of the path of the electrical current passing through the deformable members 344. Also, the deformable members are formed to provide a scrubbing or scraping action upon contact with the outer pads 358, as set forth herein. The shape of the deformable members 344 as shown, is just one of any of a variety of shapes of embodiments of the invention which are capable of providing the aforementioned aspects.

In the embodiment shown, the deformable members 344 are shaped to allow deformation of the members 344 in more than one direction. Unlike the members 244, the members 344 are not generally straight as they extend out from the base. The members 344 extend out from the base 344 in a first direction, and then turn in a second direction in a curved shape. The angles and curves of the deformable members 344 can vary in different embodiments depending on a variety of factors including the desired amount of deflection, in each direction, which the compliant section 340 is capable of, the desired spring constant of the complaint section 340, the structure, i.e. thickness, shape, etc., of the deformable members 344, the materials used in the compliant section 340, the desired amount of yielding, if any, for the structure, and other like factors. The angles and curves can vary for each member 344. The deformable members 344 each include an end 346.

As shown in FIG. 3B, the deformable members 344 are positioned in alignment with the rest of the outer conductor 330, such that the members 344 lie within a cylinder defined by the outer conductor 330. That is, the members 344 curve about the center of the contactor 300 along the length of the members 344, such that the members 344 retain the same inner diameter D3, and/or radius to the contactor's center, as the remaining portion of the outer conductor 330.

As with the members 244, by keeping the members 344 in-cylinder with the rest of the outer conductor 330, and maintaining the diameters d3 and D3 the same, the complaint section 340 keeps the impedance constant. Maintaining the impedance prevents any impedance discontinuities which could otherwise affect the performance of the contactor 300.

Of course, in other embodiments the deformable members 344 may be shaped to either extend inward toward and/or outward from the center of the contactor 300 and not be strictly aligned with the cylinder of the outer conductor 330.

As described herein with the contactors 100 and 200, the contactor 300 can have its outer conductor 330 and its compliant section 340 can be of any of a variety of the same or similar suitable materials as described. In some embodiments, the conductor 330 and compliant section 340 can be of conductive or semi-conductive materials to allow the passage of electrical signals or otherwise be electrically communicative.

As with the compliant section 240, in some embodiments, the compliant section 340 can be of materials which are deformable and/or flexible so that after deflection it returns or at least returns towards, its undeflected or initial position. This return can be complete or substantially complete to the original undeflected, or in some embodiments, be at a lesser position due to yielding. The compliant section 340 can yield during the initial deflection to set an undeflected position of the compliant section 340 for all further deformation thereof.

As with the other embodiments, the compliant section 340 can be detachable for ease and speed of replacement.

FIG. 3C shows the contactor 300 in contact with the receiving structure 350. As can be seen the compliant section 340 has been deflected as it has come into contact with the pads 354. More specifically, the undeflected deformable members 344 (shown by the dashed lines) had contacted the pads 354 and then deflected as a deflected deformable member 344'. The deflected member 344' having a deflected end 346' positioned on the surface of the pad 358. The deflection of the deformable member 344 has moved the member 344 from its undeflected position, in a direction Z (vertically as shown), towards the base 342, and in a direction Y, which is generally lateral to both the base 342 and the surface of the pads 354 or otherwise generally tangential to the cylinder.

The Y direction, or lateral, movement of the deformable members 344 along the pads 358 is capable of providing an improved electrical contact between the pads 358 and the deformable members 344. Note that the movement is not necessarily lateral, or in the Y direction, but may be in a curved path or substantially in-cylinder. In many situations electrically conductive surfaces, such as the pads 354 and the ends 346, when exposed to an environment such as air can obtain a covering or coating of an oxide, organic film or other material. Such coverings can reduce the electrical conductivity of the surface and thus reduce the performance of the device or devices involved. In some cases the build-up of oxides can be so extensive as to prevent electrical connections from being made. While the coatings can be removed from the affected surface by methods such as scraping or applying a solvent or cleaner, typically such operations are time intensive, cost prohibitive, impractical or effectively impossible.

However, embodiments of the present invention are capable of removing a coating 359 positioned over the pads 358 and coatings 348 over the deformable members 344, as shown in FIG. 3C. The deformable member 344 contacts its respective outer pad 358 at an initial location or contact point C3. Then as the compliant portion 344 is compressed and deflected, the deformable member 344 is moved both back towards the base 342 and across the surface of the outer pad 358. This moves the contact point to a contact point C3'. This movement of the deformable member 344 across the surface of the outer pad 358 causes a scrubbing and/or scraping action that clears the contacting surfaces of coatings or other build-up, such as oxides and organic films. This allows the deflected deformable portion 344' at its deflected end 346' to be cleared of its coating 348 and to have direct contact with the surface of the outer pad 358, which has also been cleared of its coating 359. This provides a better or improved electrical connection between the outer conductor 330 and the outer pads 358, increasing the overall performance of the contactor 300.

Depending on the embodiment the amount of the scrubbing and/or scraping action can vary. Increasing the roughness of the surfaces in contact will likewise increase the amount of scrubbing and/or scraping action. Decreasing the surface roughness will decrease this action. As noted herein, the amount of scrubbing action desired can be dependent on the surrounding environment, the amount of use, and other factors. The geometry of the deformable member 344 can also determine the scrub length and therefore increase or decrease the amount of scrubbing. The amount of scrubbing and/or scraping action is also dependent on the force applied by the contactor 300 onto the receiving structure 350.

As shown, the distance of the scrubbing is between the points C3 and C3'.

As shown in FIG. 3C the length of the path P3 which the electrons travel through the deformable member 344 is shortened by the shape of the deformable member 344. Because electrons will take the shortest possible route, as shown, they will travel as straight and direct path as possible. Because the deformable member 344 is shaped in a first direction as is extends from the base 342 and then turns back and curves the other direction, the path P3 is substantially straight with some deflection. That is, the path P3 effectively cuts the corner created by changing curve of the deformable member 344. The particular shape of the path P3 can vary depending on the shape of the member 344 in the particular embodiment of the invention.

With the path P3 being relative straight and having very small amount of rotation, if any, the amount of inductance is minimized, or the inductance is eliminated or substantially eliminated. As shown, the amount of rotation of the path P3 about the cylinder of the outer conductor 230 is sufficiently small to substantially prevent inductance. That is, the amount of rotation, if any, in such embodiments, is so much less than a single rotation, that the deformable members 344 function, or look like, straight (along the z-axis, downward as shown), connections between the base 342 and the pads 358, in regard to inductance.

As set forth herein, to obtain improved performance of a contactor the shortest electrical length of the travel of the electrons through the outer connector is desired. With the center conductor having a straight and direct path for the electrons to travel, obtaining the shortest electrical pathway length in the outer conductor will minimize difference or delta between electrical pathway lengths of the inner and outer conductors. In turn, this minimized the difference in time for the electrons to travel each path.

Differences in the distances or times for the travel of electrons through the inner and outer conductors can create a discontinuity which can affect the contactor's performance. This discontinuity has greater effect on performance as the frequencies are increased. For example, for embodiments carrying signals in the 30 to 40 GHz range, even small deltas in the electrical pathway lengths between inner and outer conductors will have an adverse effect on performance.

In some embodiments discontinuities due to a delta in electrical pathway lengths of the conductors may produce second order effects relative to discontinuities resulting from changes in the impedance, however, certain applications, such as very high signal frequencies, these second order effects are to be minimized to system improve performance.

In the embodiments shown in FIGS. 3A-C, in the compliance section 340, the electrical pathway length, or path P3, is reduced to minimize the delta of the electrical pathways of the conductors. This minimization of the delta results in a reduction of discontinuities and therefore an increase in performance. The shortened pathway is provided with the deformable members 344 having a structure which allows for sufficient deflection to make the outer conductor 330 compliant. Also, the deformable members 344 are shaped to provide a scrubbing action to improve the electrical contact with the pads 358 of the receiving structure 350.

Varying shapes of the deformable members in some embodiments of the present invention can change the location of the point of contact between the deformable member 344 and the receiving structure 350. In turn, the position of the contact point C3 can vary both the length of the path P3 and the lateral movement and resulting scrubbing action between the deformable member 344 and the pad 358.

The specific position of the end 346 and the contact point C3 relative to the connection 343 can vary depending on the embodiment. In some embodiments, as shown, the end 346 is positioned such that the contact point C3 is just lateral to the connection 343. In other embodiments the contact point can be directly beneath, behind, or other positions here about.

In some embodiments, the use of gold or gold-plated materials for the deformable members 344 and/or on the pads 358, greatly reduces the amount of wear, extending the life of the contactor 300. Other possible material included palladium, rhodium, and other non-oxidizing materials now known or later developed.

It will be clear to one skilled in the art that other possible shapes and configuration of the deformable members 344 are possible, which reduce or minimize the electrical pathway length while providing sufficient geometry to obtain the desired compliant and contactor performance. Also, in other embodiments, the center conductor 310, spacer 320 and outer conductor 330 can be arranged in a substantially or generally concentric or coaxial manner, or in other embodiments arranged in a non-concentric manner or otherwise offset to one another. Likewise, in some embodiments more than one center conductor 310, spacer 320 and/or outer conductor 330 can be used. Further, the shapes of each of the center conductor 310, spacer 320 and/or outer conductor 330 can vary.

Compliant Sections with Shortened Electrical Paths and Increased Shielding:

In some embodiments of the present invention the contactor has a compliant section with deformable members shaped into a crossing, a crisscross and/or an 'X' pattern. These shapes allow for deformation while reducing or minimizing the length of the path of the electrons while providing increased signal shielding. The reduced electrical path provides a reduction in any discontinuity caused by a difference between the lengths of the electron paths of the inner and outer conductors.

Figure 4:
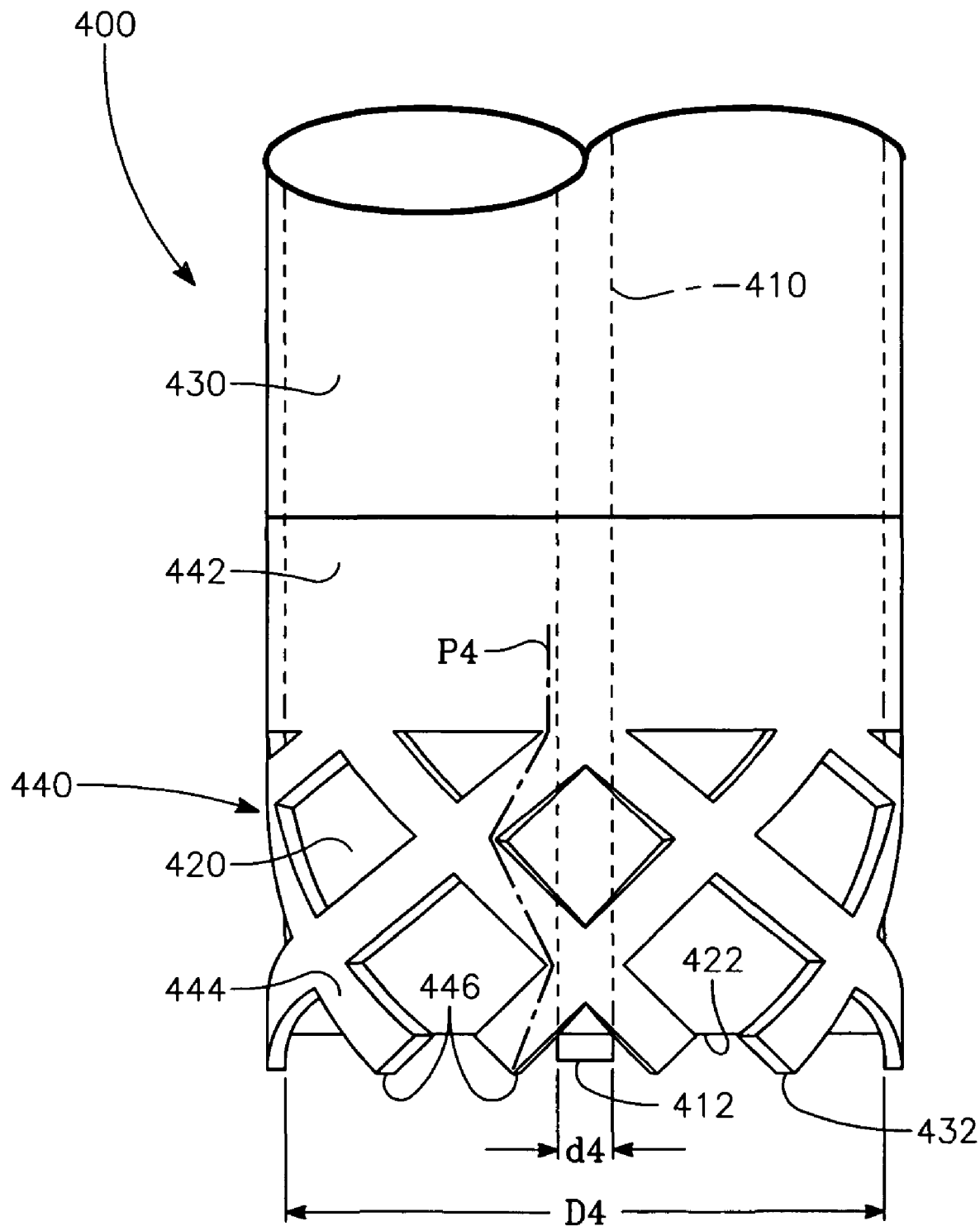
FIG. 4 shows a side view of a device in accordance with at least one embodiment of the present invention.

As shown in FIG. 4, a contactor 400 includes a center or inner or first conductor or center pin or signal conduit 410, a spacer or insulator 420, and an outer or second conductor or ground or shield or return 430. The outer conductor 430 is compliant by being deformable and includes a compliant section or portion or member 440, which is positioned at least adjacent to an end 432. The contactor 400 can be received by a receiving structure or device interface board or DIB (not shown) with contact pads (not shown) like those of structures 250 and 350.

The contactor 400 can be attached to a cable (not shown) on an end (not shown) opposite of the end 432. The attached cable can be a coaxial cable and can be floating, such that the cable moves with the displacement of the contactor 400.

In some embodiments, the center conductor 410 is undeformable, or at least substantially undeformable, so that it provides a specific defined electrical length of the contactor 400. The defined length of the contactor 400 is independent of any compliance, deformation and/or deflection of the compliant section 440 of the outer conductor 430, as further described herein. As such, changes in the compliance of the compliant section 440 do not affect the electrical length of the contactor 400.

The compliant section 440 includes deformable members or beams or fingers 444 extending out (downward as shown) from a base 442 in a crossed or 'X' pattern. The deformable members 444 allow for deformation by bending and are formed to provide a scrubbing or scraping action upon contact with the outer pads (not shown).

The positioning angles and arrangement of the deformable members 444 can vary in different embodiments depending on a variety of factors including the desired amount of deflection, the desired spring constant, the structure, i.e. thickness, shape, etc., of the deformable members 444, the materials used, the desired amount of yielding, if any, and other like factors. The angles of the members 444 relative to each other and to the base 442 can vary for each member 444, and in some embodiments, vary along the length of each member 444. Each deformable member 444 includes an end 446.

The deformable members 444 can be positioned to be in alignment with the rest of the outer conductor 430, such that the members 444 lie within a cylinder defined by, and extending from rest of the outer conductor 430. That is, the members 444 retain the same inner diameter D4, and/or radius to the contactor's center, as the remaining portion of the outer conductor 430. Keeping the members 444 in-cylinder with the rest of the outer conductor 430, and maintaining the diameters d4 and D4 the same, the complaint section 440 keeps the impedance constant, preventing any impedance discontinuities. The deformable members 444 can also extend inward toward and/or outward from this cylinder.

The contactor 400 and its components can be of any suitable material as described herein, including conductive materials for the outer conductor 430 and deformable materials for the compliant section 440. The compliant section 440 can, after deflection, return to its undeflected position, or return to a lesser position due to yielding. Yielding can be used to set an undeflected position after an initial deflection.

As with the other embodiments, the compliant section 440 can be detachable for ease and speed of replacement.

As the ends 446 contact their respective pads (not shown), the deformable members 444 will deflect such that the ends 446 will move laterally across the surface of the pads. The particular direction that each of the ends 446 move will depend on the arrangement of the given member 444 which the end 446 is attached to. In some embodiments, alternating ends 446 will move in alternating and opposite lateral directions. The lateral movement of the ends 446 will cause a scrubbing or scraping action, which can remove coatings and/or build-up (not shown) on the contact surfaces of both the pads and the ends 446. The removal of the coatings will provide improved electrical contacts between the pads and the deformable members 444. The amount of the scrubbing can be varied by the roughness of the surfaces in contact and the force applied by the contactor 400 onto the receiving structure.

As shown, the compliant section 440 has pathways P4, which the electrons travel between the base 442 and the contacted pads. With the crossing of the deformable members 444, the electrons can travel a shorter path then if they were required to travel down the entire length of a deformable member 444. The pathways P4 will deform to some extent with the deflection of the deformable members 444.

This shortened pathway minimizes the difference or delta between electrical pathway lengths of the inner and outer conductors. Minimizing the delta in electrical pathway lengths, in turn minimizes any discontinuities, improving the performance of the contactor.

With deformable members 444 crossing in generally opposing directions, the open space between the structure of the compliant section 440 is reduced, relative to other embodiments. This decrease in openings about the compliant section 440 provides for an increase in the shielding of the contactor 400. This increased shielding provides a reduction, relative to other embodiments, of signal transmission from the contactor 400, cross-talk with adjacent devices, RF leakage, EMI, and/or electrical noise.

Of course, other possible shapes and configurations of the deformable members 444 are possible, which reduce or minimize the electrical pathway length, while providing sufficient mechanical length to obtain the desired compliance and contactor performance. Also, in other embodiments, the center conductor 410, spacer 420 and outer conductor 430 can be arranged in a substantially or generally concentric or coaxial manner, or in other embodiments arranged in a non-concentric manner or otherwise offset to one another. Likewise, in some embodiments more than one center conductor 410, spacer 420 and/or outer conductor 430 can be used. Further, the shapes of each of the center conductor 410, spacer 420 and/or outer conductor 430 can vary.

Compliant Sections with a Shield:

In some embodiments the compliant section also includes a structure positioned about the deformable members to provide shielding and/or support.

Figure 5:
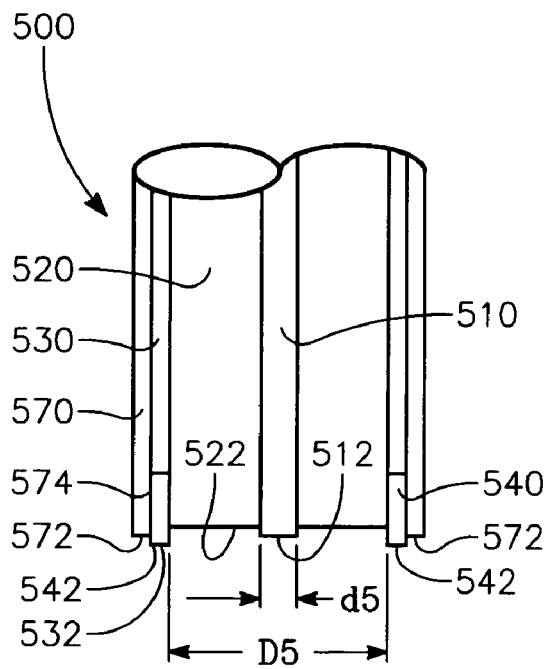
FIG. 5 shows a side cross-sectional view of a device in accordance with at least one embodiment of the present invention.

As shown in FIG. 5, a contactor 500 includes a center or inner or first conductor or center pin or signal conduit 510, a spacer or insulator 520, and an outer or second conductor or ground or shield or return 530. The outer conductor 530 is compliant by being deformable and includes a compliant section or portion or member 540, which is positioned at least adjacent to an end 532. The contactor 500 can be received by a receiving structure or device interface board or DIB (not shown) with contact pads (not shown), like those of structures 250 and 350.

The contactor 500 can be attached to a cable (not shown) on an end (not shown) opposite of the end 532. The attached cable can be a coaxial cable and can be floating, such that the cable moves with the displacement of the contactor 500.

In some embodiments, the center conductor 510 is undeformable, or at least substantially undeformable, so that it provides a specific defined electrical length of the contactor

500. The defined length of the contactor 500 is independent of any compliance, deformation and/or deflection of the compliant section 540 of the outer conductor 530, as further described herein. As such, changes in the compliance of the compliant section 540 do not affect the electrical length of the contactor 500.

The compliant section 540 includes an end 542. The compliant section 540 can be any of a variety of embodiments including any of those set forth herein, such as the compliant portions 140, 240, 340, 440. In at least one embodiment, the compliant section 540 includes an outer shield 570 which is positioned about and adjacent the compliant section 540.

The outer shield 570 can function to provide additional shielding to prevent or limit the transmission of a signal from the contactor 500. Transmission of a signal from a contactor may be received by any adjacent device and in so doing effect the operation of the adjacent device. Signal transmission, cross-talk, RF leakage, EMI, and/or electrical noise can be eliminated, or at least limited, by the outer shield 570.

The outer shield 570 can also function to provide support to the compliant section 540 by preventing, or at least limiting, deflection of the deformable members in outward directions. In this manner the outer shield 570 retains the compliant section 540 within, or at least generally within, the cylinder defined by the outer conductor 530. Also, by retaining the compliant section 540 the outer shield 570 facilitates maintaining the inner diameter D5 of the compliant section 540, and therefore the maintains a constant impedance along the contactor 500. In some embodiments, the shield 570 prevents buckling or other similar deflections of the compliant section 540, by sandwiching the compliant section 540 between the outer shield 570 and the dielectric 520.

While in some embodiments, such as that shown, the outer shield 570 does extend the outer diameter of the contactor 500, it does not have an effect on the impedance, since no change has been made to the inner diameter D5. As such, the use of the shield 570 does not cause impedance discontinuities which would adversely affect performance of the contactor 500.

The outer shield 570 can be any of a variety of materials that would provide shielding for signals carried by the contactor 500. Such materials include conductive materials such as copper, gold, stainless steel, beryllium copper, a gold plated material such as stainless steel plated in gold or beryllium copper plated in gold, and the like. While a non-conductor material can be used in some embodiments, it will not provide signal shielding, but could provide support to the compliant section 540. In some embodiments, a combination of conductor, non-conductor, semi-conductor and/or ESD materials could be used.

The size and length of the shield 570 can vary depending on the embodiment. In some embodiments, as shown, the shield 570 extends covering most of the compliant section 540, to a shield end 572.

The shield end 572 can be positioned such that the compliant section 540 extends out from the shield end 572 a distance equal to, or about equal to, the desired or expected deflection of the compliant section 540, as it is received by the receiving structure (not shown). As such, the outer shield 570 will cover, or substantially cover, the compliant section 540 in this deflected position when it is contact with the pads (not shown) and a signal is being transmitted within the contactor 500. With the compliant section 540 so deflected, the end 532 is close to flush, with the shield end 572. The shield end 572 being positioned to align with the deflected end 532, the outer shield 570 can be fixed, non-movable, or non-compliant, reducing complexity and cost of the contactor 500.

The specific amount which the compliant section 540 will extend past the outer shield 570 can vary depending on the desired or expected deflection of the compliant section 540. For example, in various embodiments the compliant section 540 extends out from the outer shield 570 between 6-8 mils or thousandths of an inch.

In some embodiments, the end 572 extends to align, or generally align, with the dielectric 520. This allows the end 512 to be positioned so that the compliant section 540 can be deflected sufficiently that the end 522 is adjacent or abutting the receiving structure, without an air gap, or nearly no gap, forming therebetween. This embodiment also allows the deflection of the compliant section 540 to be limited to prevent compression of the dielectric 520.

The outer shield 570 has an inner wall 574 which is positioned to receive and support the compliant section 540. As shown, in some embodiments, the inner wall 574 abuts the compliant section 540, such that the compliant section 540 can not deflect outward. In other embodiments, the inner wall 574 is positioned adjacent or near the compliant section 540, such to limit any outward movement of the compliant section 540. By proving a space between the outer shield 570 and the compliant section 540, the compliant section 540 can move adjacent the inner wall 574 during its deflection during contact with the receiving structure, without friction or binding.

The outer shield 570 makes the compliant section 540 more robust by allowing it to accommodate greater loads without buckling, undesired deflection or other such problems.

In various embodiments the outer shield 570 is movable, deformable, and/or compliant. This allows the outer shield 570 to be deflected with the compliant section 540. In some embodiments, the outer shield 570 is substantially continuous or without openings as shown in FIG. 5. But, in other embodiments the outer shield 570 can have openings (not shown) and/or be one or more structures with a series of openings therebetween. With openings in the outer shield 570, or with structures forming the shield 570, the outer shield 570 can be deformable and/or compliant, as further set forth in some embodiments herein.

In other embodiments, the center conductor 510, spacer 520, outer conductor 530, and the shield 570 can be arranged in a substantially or generally concentric or coaxial manner, or in other embodiments arranged in a non-concentric manner or otherwise offset to one another. Likewise, in some embodiments more than one center conductor 510, spacer 520, outer conductor 530, and/or shield 570 can be used. Further, the shapes of each of the center conductor 510, spacer 520, outer conductor 530 and/or shield 570 can vary.

Multiple Compliant Sections:

In some embodiments, the outer conductor includes a first compliant section and a second compliant section positioned about the first compliant section. The positioning of the second compliant section can be concentric to the first compliant section. The second compliant section can, depending on the embodiment, increase the shielding and the contact surface with the pad or pads which the outer conductor is received. The second compliant section can also support the first compliant section to prevent or limit buckling or outward deflection.

Figure 6:
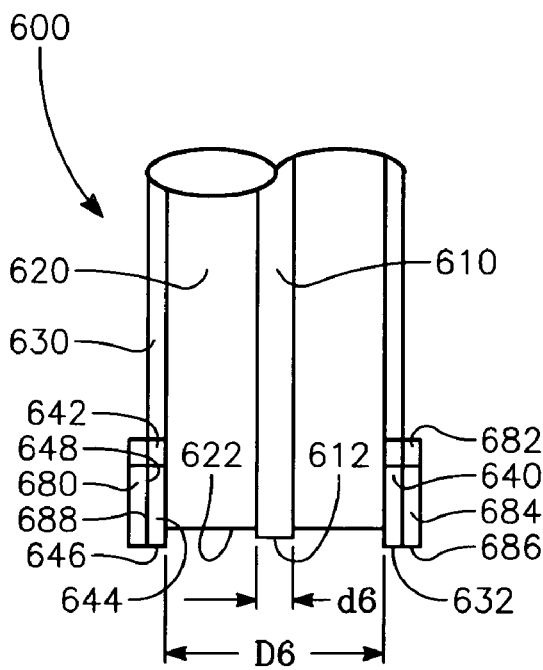
FIG. 6 shows a side cross-sectional view of a device in accordance with at least one embodiment of the present invention.

As shown in FIG. 6, a contactor 600 includes a center or inner or first conductor or center pin or signal conduit 610, a spacer or insulator 620, and an outer or second conductor or ground or shield or return 630. The outer conductor 630 is compliant by being deformable and includes a first or inner compliant section or portion or member 640 and a second or outer compliant section or portion or member 680. Both the first compliant section 640 and the second compliant section 650 are positioned at least adjacent to an end 632 of the outer conductor 630. The contactor 600 can be received by a receiving structure or device interface board or DIB (not shown) with contact pads (not shown), like that of the receiving structures 250 and 350.

The contactor 600 can be attached to a cable (not shown) on an end (not shown) opposite of the end 632. The attached cable can be a coaxial cable and can be floating, such that the cable moves with the displacement of the contactor 600.

In some embodiments, the center conductor 610 is undeformable, or at least substantially undeformable, so that it provides a specific defined electrical length of the contactor 600. The defined length of the contactor 600 is independent of any compliance, deformation and/or deflection of the first compliant section 640 and the second compliant section 650, as further described herein. As such, changes in the compliance of the first compliant section 640 and the second compliant section 650 do not affect the electrical length of the contactor 600.

The first compliant section 640 includes a first base 642, and at least one first deformable member 644 having a first member end 646. The first compliant section 640 can be any of a variety of embodiments including any of those set forth herein, such as the compliant sections 140, 240, 340, 440 and the like.

The second compliant section 680 includes a second base 682, and at least one second deformable member 684 having an end 646. The second compliant section 680 can be any of a variety of embodiments, including any of those set forth herein, such as the compliant sections 140, 240, 340, 440 and the like. The arrangement and configuration of the first compliant section 640 and the second compliance section 680 can match one another or can vary. In some embodiments, the second compliant section 680 is arranged opposite to that of the first compliant section 640, such that the direction of the second deformable members 684 are opposite to the direction of the first deformable members 644. In this manner the first deformable members 644 and second deformable members 684 will crisscross.

In other embodiments, the second deformable members 684 are offset or shifted in a circumferential direction relative to the first deformable members 644, such that at least a portion of the openings in the first compliant section 640 are covered by at least a portion of the second deformable members 684. In other embodiments, different patterns of deformable members are employed in each of the first and second compliant sections.

Increased shielding can be obtained with embodiments where deformable members of the first and second compliant sections are not aligned, but instead cross over, are offset, or otherwise cover openings of the other compliant sections.

With the second compliant section 680 positioned adjacent to at least a portion of the first compliant section 640, such that an inner wall 688 of the second compliant section 680 is in contact with, or adjacent to, the outer wall 648 of the first compliant section 640, then the second complaint section 680 can provide support to the first compliant section 640, to prevent or limit buckling or outward deformation.

With the second compliant section 680 retaining the first compliant section 640, the first compliant section 640 can be kept within a cylinder defined by the outer conductor 630. Also, by retaining the first compliant section 640, the inner diameter D6 of the fist compliant section 640 can be maintained. This keeps the impedance constant along the length of the contactor 600, without any discontinuities that could adversely affect performance. With first compliant section 640 set, or sandwiched, between the spacer 620 and the second compliant section 680, both outward and inward buckling of the first compliant section 640 is prevented or limited.

While in some embodiments, such as that shown, the second compliant section 680 extends the outer diameter of the contactor 600, it does not have a significant effect on the performance since no change has been made to the inner diameter D6. As such, the second compliant section 680 does not cause any impedance discontinuities.

The first compliant section 640 and the second compliant section 680 can be any of a variety of materials including conductive materials such as copper, gold, stainless steel, beryllium copper, a gold plated material such as stainless steel plated in gold or beryllium copper plated in gold, and the like. While non-conductor materials can be used, they will not provide an additional electrical path or provide signal shielding. However, non-conductor materials can still provide support to the first compliant section 640 to prevent buckling and outward deformations. In some embodiments, a combination of conductor, non-conductor, semi-conductor and/or ESD materials can be used.

The size and length of the second compliant section 680 can vary depending on the embodiment. In some embodiments, as shown, the second compliant section 680 is the same length as the first compliant section 640, such that the first member ends 646 and the second member ends 686 are aligned or flush. In other embodiments, either the first compliant section 640 or the second compliant section 680 extend past the other section. These embodiments allow the compliance of the contactor to have a stage or stepped compliance, where the effective spring constant of the outer conductor changes as each of the first and second compliant section contact the receiving structure (not shown) and are deflected.

In variuous embodiments, either one, or both, the first member ends 646 and/or the second member ends 686 extend past the end 612 of the center conductor 610. This allows either, or both, of the ends 646 and 686 to be in contact with their respective pads (not shown) and be deflected at the point when the center conductor 610 contacts its respective pad (not shown).

In some embodiments, more than two compliant sections can be used, and these compliant sections can be concentric to each other and the contactor. Also, in other embodiments, the center conductor 610, spacer 620, outer conductor 630, first compliant section 640 and second compliant section 650 can be arranged in a substantially or generally concentric or coaxial manner, or in other embodiments arranged in a non-concentric manner or otherwise offset to one another. Likewise, in some embodiments more than one center conductor 610, spacer 620, outer conductor 630, first compliant section 640 and/or second compliant section 650 can be used. Further, the shapes of each of the center conductor 610, spacer 620, outer conductor 630 first compliant section 640 and second compliant section 650 can vary.

Compliant Sections Positioned Out of Cylinder:

In some embodiments, the compliant section can be positioned fully or at least partially out of the cylinder defined by the outer conductor. This out of cylinder positioning can be either inward, i.e. towards the center of the contactor, or outward from the cylinder of the outer conductor. In some embodiments, the out of cylinder positioning of the compliant section is accompanied with a change in the inner diameter of the outer conductor at the compliant section. The effect of the change in diameter on the impedance continuity can be compensated for, or at least mitigated, with corresponding changes in the outer diameter of the inner conductor and/or the dielectric constant of the spacer.

Like other compliant sections set forth herein, the out of cylinder compliant section can function with a variable length to accommodated variable positioning or alignment of the surfaces which the compliant section contacts. Further, in some embodiments with the compliant section biased, a force can be exerted by the compliant section upon the surface pads to facilitate contact. With the compliant section being electrically conductive, the outer conductor can make an electrical connection with the receiving structure upon contact. The compliant section can also function as a shield to prevent or limit transmission of signals from the contactor.

Figure 7:
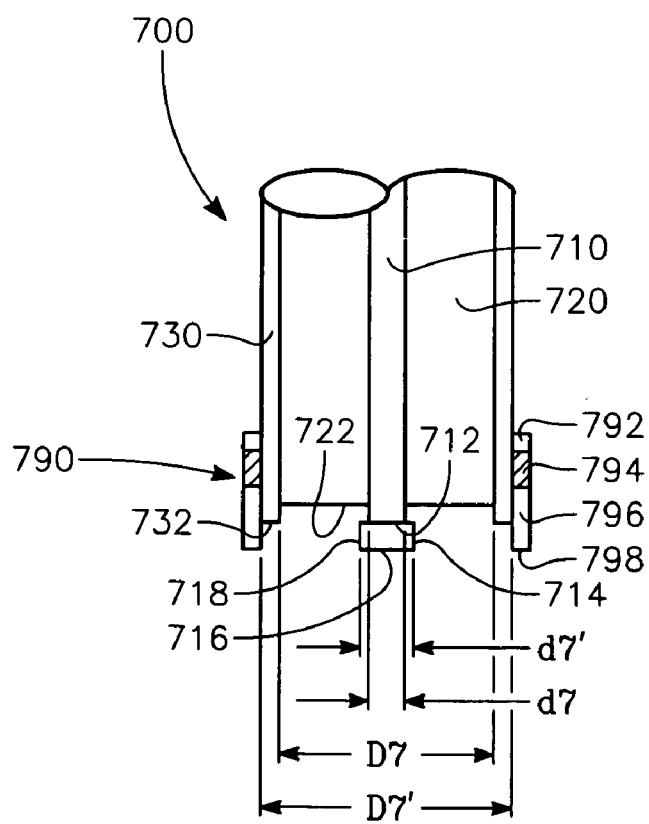
FIG. 7 shows a side cross-sectional view of a device in accordance with at least one embodiment of the present invention.

As shown in FIG. 7, a contactor 700 includes a center or inner or first conductor or center pin or signal conduit 710, a spacer or insulator 720, and an outer or second conductor or ground or shield or return 730. The outer conductor 730 has, adjacent to its end 732, a deformable and/or deflectable compliant section or portion or member 790. The contactor 700 can be received by a receiving structure or device interface board or DIB (not shown) having contact pads (not shown), such as the structures 250 and 350.

The contactor 700 can be attached to a cable (not shown) on an end (not shown) opposite of the end 732. The attached cable can be a coaxial cable and can be floating, such that the cable moves with the displacement of the contactor 700.

In some embodiments, the center conductor 710 is undeformable, or at least substantially undeformable, so that it provides a specific defined electrical length of the contactor 700. The defined length of the contactor 700 is independent of any compliance, deformation and/or deflection of the compliant section 790, as further described herein. As such, changes in the compliance of the compliant section 790 do not affect the electrical length of the contactor 700.

The compliant section 790 can be any of a variety of embodiments including those herein, such as the compliant portions 140, 240, 340, 440, 640 and 740. Also, the compliant section can include a shield such as that of the shield 570.

In some embodiments, such as that shown in FIG. 7, the compliant section 790 can include a base 792, a deformable member 794, a contact portion 796 and an end 798. The base 792 is mounted or attached to the outer conductor 730 and can be can be detachable. The deformable member 794 can include a spring, a flexure, a compressible gas piston, or similar biasing device which allows the compliant section 790 to be deformed or deflected. The deformable member 794 can exert a biasing force upon the contact portion 796 to urge it towards the receiving structure. The deformable member 794 can be pre-loaded, such that a biasing force is exerted upon the contact portion 796 in its undeflected position. In some embodiments, the deformable member 794 is yieldable, where upon initial deflection the member 790 will not return completely to its initial undeflected position. In some embodiments, the deformable member 794 is configured or arranged in a manner such as that of any of the deformable members 244, 344, 444, 644, 744 or the compliant sections 240, 340, 440, 640, 740. The contact portion 798 is movable to allow for contact with the receiving structure and for compensation for positioning of the pads on the receiving structure.

The compliant section 790 can be a ferrule, positioned concentric and about the outer conductor 730. The compliant section 790 can be attached to a non-compliant or otherwise rigid outer conductor 730. The compliant section 790 can be permanently attached to, or detachable from, the outer conductor 730.

In some embodiments, such as that shown, the compliant section 790 enlarges the inner diameter D7 of the contactor 700 to a diameter D7'. This larger diameter D7' occurs where the compliant section 790 extends out (downward as shown) from the end 732 of the outer conductor 730.

In some embodiments any effect to the impedance of the contactor 700 due to the change in the inner diameter D7, may be compensated for with a corresponding change either in the outer diameter d7 of the inner conductor 710 and/or in the dielectric constant, at the location of the change in the inner diameter D7. In the embodiment shown, an extension member 714 is attached or mounted to the inner conductor 710 at the end 712. The extension 714 includes a contact end 716 for contacting the receiving structure. The diameter or width of the extension 714 is d7', can be sized to compensate for the larger inner diameter D7'. This compensation can be done using the equation E1, set forth herein, to determine a value of d7' which eliminates, or limits, the change in the impedance of the contactor 100 at this location. But other factors such as the open area of the compliant contactor, degrees of wrap angle, size of step, fringing capacitance, geometry of the receiving pad and other factors can affect the impedance. Further, the change in the dielectric constant at the location of the changes in the diameter D7', can be used with equation E1 to determine an appropriate diameter d7'.

The extension 714 can be permanently attached to the inner conductor 710 or be detachable therefrom.

In some embodiments, the extension 714 is undeformable, or at least substantially undeformable, so that it with the center conductor 710 provide a specific defined electrical length of the contactor 700, independent of any compliance, deformation and/or deflection of the compliant section 790.

The extension 714 and the compliant section 790 can be any of a variety of materials as set forth herein, including conductive materials such as copper, gold, stainless steel, beryllium copper, a gold plated material such as stainless steel plated in gold or beryllium copper plated in gold, and the like. in some embodiments, a combination of conductor, non-conductor, semi-conductor, and/or ESD materials could be used as well.

The sizes and lengths of the extension 714 and the compliant section 790 can vary depending on the embodiment.

Also, in other embodiments, the center conductor 710, spacer 720, outer conductor 730 and compliant section 790 can be arranged in a substantially or generally concentric or coaxial manner, or in other embodiments arranged in a non-concentric manner or otherwise offset to one another. Likewise, in some embodiments more than one center conductor 710, spacer 720, outer conductor 730 and/or compliant section 790 can be used. Further, the shapes of each of the center conductor 710, spacer 720, outer conductor 730 and/or compliant section 790 can vary.

Compliant Sections Having Deformable Members with Attached Ends:

In some embodiments of the present invention the contactor has a compliant section with deformable members which are attached at their ends. In some embodiments, all of the ends are attached together in a ring or cylinder. These shapes allow for deformation while supporting the ends of the deformable members to keep the ends within the cylinder defined by the outer conductor. This prevents the ends from either deflecting inward or outward which could otherwise affect the impedance of the contactor.

Figure 8:
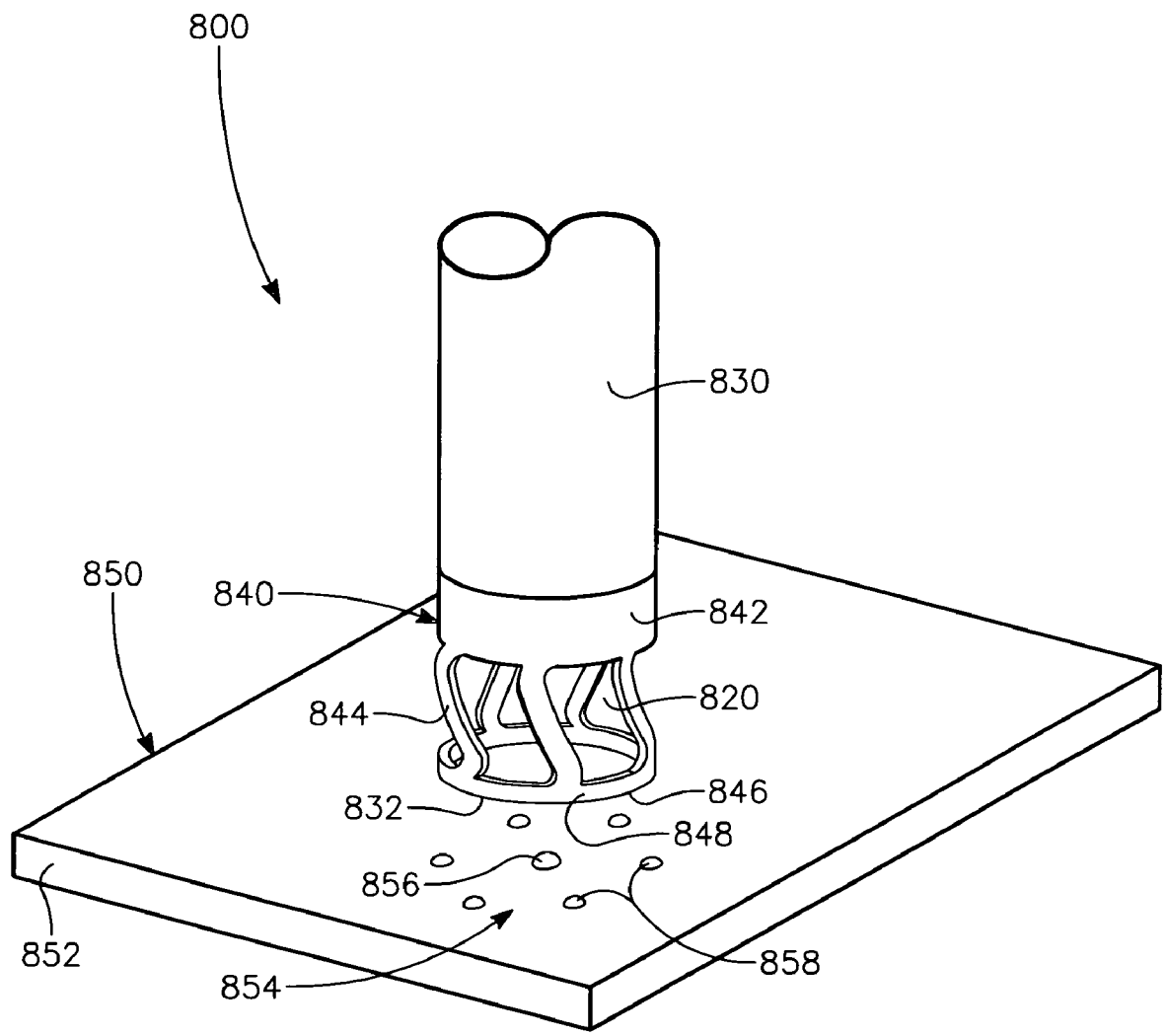
FIG. 8 shows a perspective view of a device in accordance with at least one embodiment of the present invention.

As shown in FIG. 8, a contactor 800 includes a center or inner or first conductor or center pin or signal conduit (not shown), a spacer or insulator 820 positioned about the center conductor, and an outer conductor or ground or shield or return 830. The outer or second conductor 830 is compliant by being deformable and includes a compliant section or portion or member 840, which is positioned at least adjacent to an end 832. The contactor 800 can be received by a receiving structure or device interface board or DIB 850 with contact pads 854, like those of structures 250 and 350.

The contactor 800 can be attached to a cable (not shown) on an end (not shown) opposite of the end 832. The attached cable can be a coaxial cable and can be floating, such that the cable moves with the displacement of the contactor 800.

In some embodiments, the center conductor is undeformable, or at least substantially undeformable, so that it provides a specific defined electrical length of the contactor 800. The defined length of the contactor 800 is independent of any compliance, deformation and/or deflection of the compliant section 840, as further described herein. As such, changes in the compliance of the compliant section 840 do not affect the electrical length of the contactor 800.

The compliant section 840 includes deformable members or beams or fingers 844 extending out (downward as shown) from a base 842 to a connecting structure or ring 848. The deformable members 844 allow for deformation by bending. The ring 848 can be formed to provide a scrubbing or scraping action upon contact with the outer pads 858.

The positioning angles and arrangement of the deformable members 844 can vary in different embodiments depending on a variety of factors including the desired amount of deflection, the desired spring constant, the structure, i.e. thickness, shape, etc., of the deformable members 844, the materials used, the desired amount of yielding, if any, and other like factors.

The deformable members 844 and the ring 848 can be positioned to be in alignment with the rest of the outer conductor 830, such that the members 844 and ring 848 lie within a cylinder defined by, and extending from rest of the outer conductor 830. That is, the members 844 retain the same inner diameter, and/or radius to the contactor's center, as the remaining portion of the outer conductor 830. Keeping the members 844 and ring 848 in-cylinder with the rest of the outer conductor 830, and maintaining the outer diameter of the center conductor the same value and the inner diameter of the members 844 and ring 848 the same, allows the complaint section 840 to keep the impedance constant to facilitate preventing any impedance discontinuities. The ring 848 prevents the deformable members 844 from deforming to extend inward toward and/or outward from this the cylinder of the outer conductor 830.

The contactor 800 and its components can be of any suitable material as described herein, including conductive materials for the outer conductor 830 and deformable materials for the compliant section 840. The compliant section 840 can, after deflection, return to its undeflected position, or return to a lesser position due to yielding. Yielding can be used to set an undeflected position after an initial deflection.

As with the other embodiments, the compliant section 840 can be detachable for ease and speed of replacement.

The ring 848 includes an end 846 which functions to contact its respective pads (not shown). As contact is made, the deformable members 844 will deflect such that the ring 848 will move about the cylinder of the outer conductor 830 in a manner lateral and across the surface of the pads. The motion could also be in a circular, or twisting motion. The particular direction that the ring 848 moves will depend on the arrangement of the members 844. The lateral movement of the ring 848 and the end 846 across the pads will cause a scrubbing or scraping action, which can remove coatings and/or build-up (not shown) on the contact surfaces of both the pads and the end 846. The removal of the coatings will provide improved electrical contacts between the pads and the ring 848. The amount of the scrubbing can be varied by the roughness of the surfaces in contact and the force applied by the contactor 800 onto the receiving structure. In some embodiments the end 846 can include ridges and/or bumps positioned to contact the surface of the pads and to facilitate the scrubbing action. For example, in at least one embodiment the ring 848 is shaped in to a crown formation.

Other possible shapes and configurations of the deformable members 844, the ring 848 and the end 846 other than those shown are possible. Also, in other embodiments, the center conductor, spacer 820 and outer conductor 830 can be arranged in a substantially or generally concentric or coaxial manner, or in other embodiments arranged in a non-concentric manner or otherwise offset to one another. Likewise, in some embodiments more than one center conductor, spacer 820 and/or outer conductor 830 can be used. Further, the shapes of each of the center conductor, spacer 820 and/or outer conductor 830 can vary.

Having described this invention in connection with a number of embodiments, modification will now certainly suggest itself to those skilled in the art. As such, the invention is not to be limited to the disclosed embodiments except as required by the appended claims.

What is claimed is:

1. An axial cable configured to contact a receiving structure, the axial cable comprising:
   a) a first conductor generally axially aligned with the axial cable and configured to contact the receiving structure at a first conductor end, wherein the first conductor is non-compliant;
   b) a second conductor disposed about the first conductor;
   c) a second conductor contactor positioned about the first conductor and secured to an end of the axial cable, wherein the second conductor contactor is configured to contact the receiving structure at a second conductor contactor end, wherein the second conductor contactor end is positioned to contact the receiving structure prior to the first conductor end contacting the receiving structure as the axial cable contacts the receiving structure, and wherein the second conductor contactor is compliant to allow the first conductor end to contact the receiving structure;
   d) a spacer positioned between the first conductor and the second conductor contactor; and
   e) wherein the second conductor contactor has a central axis aligned with a central axis of the axial cable, and wherein the second conductor contactor electrically contacts the second conductor.

2. The axial cable of claim 1, wherein the first conductor is configured to carry a signal and the second conductor is configured to be at least one of (a) a return for the signal; or (b) a ground.

3. The axial cable of claim 1, wherein the spacer comprises at least one of: (1) an insulator; (2) a non-conductor; (3) a semi-conductor; or (4) an ESD material.

4. The axial cable of claim 1, wherein the first conductor, the second conductor, and the spacer are at least one of: (1) concentric; and (2) coaxial.

5. The axial cable of claim 1, wherein the second conductor contactor comprises a deformable member.

6. The axial cable of claim 1, wherein the second conductor contactor is substantially cylindrical.

7. The axial cable of claim 1, wherein the axial cable has a length, and wherein the axial cable has a substantially constant impedance along the length.

8. The axial cable of claim 1, wherein the second conductor contactor is removable.

9. The axial cable of claim 1, wherein the receiving structure comprises a center conductor mating surface and an outer conductor mating surface, and wherein the second conductor contactor end is positioned to contact the outer conductor mating surface on the receiving structure prior to the first conductor contacting the center conductor mating surface on the receiving structure.

10. The axial cable of claim 9, wherein the second conductor contactor is configured to flex in response to contacting the receiving structure and wherein the second conductor contactor is adapted to scrape at least a portion of the outer conductor mating surface in response to flexing.

11. The axial cable of claim 1, wherein the second conductor contactor comprises at least one of: (a) helical structure; (b) a coil structure; (c) a twisting structure; (d) a spiral structure; (e) a crown structure; (f) a lattice structure; or (g) a multi-fingered structure.

12. The axial cable of claim 1, wherein the second conductor contactor is adapted to scrape at least a portion of the receiving structure in response to contacting the receiving structure.

13. The axial cable of claim 1, wherein the second conductor contactor end comprises at least one of: (a) substantially straight bendable structures; (b) curved bendable structures; or (c) bent deflectable structures.

14. The axial cable of claim 1, wherein the second conductor contactor comprises at least one of (a) a deformable portion; or (2) a deflectable portion.

15. The axial cable of claim 1, wherein the second conductor contactor comprises deformable portions having attached ends.

16. The axial cable of claim 15, wherein a contact surface of the attached ends of the deformable portions comprises a scraping surface.

17. The axial cable of claim 1, further comprising a biasing member and a limiter about the second conductor.

18. The axial cable of claim 1, wherein the second conductor contactor comprises a compliant ferrule, and wherein the first conductor further comprises an extension tip.

19. The axial cable of claim 1, further comprising a support shield about a compliant portion of the second conductor contactor.

20. The axial cable of claim 1, wherein the second conductor contactor end comprises at least one of: (a) substantially straight structures; (b) curved structures; or (c) bent structures.

21. The axial cable of claim 1, wherein the second conductor contactor defines a substantially cylindrical shape; and
wherein the second conductor contactor comprises deformable portions having attached ends, the deformable portions configured to retain the substantially cylindrical shape of the second conductor contactor when deforming upon engagement of the axial cable with the receiving structure.

22. The axial cable of claim 21, wherein a contact surface of the attached ends of the deformable portions comprises a scraping surface.

23. The axial cable of claim 1, wherein the second, conductor contactor comprises a plurality of deformable members arranged, in combination, substantially in a circle having a diameter, and wherein the diameter remains substantially unchanged upon deformation of the deformable members upon engagement of the axial cable with the receiving structure.

24. The axial cable of claim 23, wherein a substantially uniform spacing is maintained between the first conductor and the second conductor along a length of the first conductor.

\* \* \* \* \*

UNITED STATES PATENT AND TRADEMARK OFFICE
CERTIFICATE OF CORRECTION

PATENT NO. : 7,946,853 B2
APPLICATION NO. : 11/479205
DATED : May 24, 2011
INVENTOR(S) : Keith J. Breinlinger et al.

It is certified that error appears in the above-identified patent and that said Letters Patent is hereby corrected as shown below:

At column 27, claim 14, line 27, "at least one of (a)" should read --at least one of (1)--.

At column 28, claim 23, line 23, "wherein the second," should read --wherein the second--.

Signed and Sealed this
Eighth Day of November, 2011

David J. Kappos
*Director of the United States Patent and Trademark Office*